United States Patent
Zaghloul et al.

(10) Patent No.: US 12,089,385 B2
(45) Date of Patent: Sep. 10, 2024

(54) HIGHLY-CONFORMAL, PLIABLE THIN ELECTROMAGNETIC SKIN

(71) Applicant: U.S. Army Combat Capabilities Development Command, Army Research Laboratory, Adelphi, MD (US)

(72) Inventors: Amir I. Zaghloul, Bethesda, MD (US); Quang Minh Nguyen, Severn, MD (US); Eric D. Adler, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 849 days.

(21) Appl. No.: 17/123,902

(22) Filed: Dec. 16, 2020

(65) Prior Publication Data

US 2022/0192066 A1    Jun. 16, 2022

(51) Int. Cl.
| H05K 9/00 | (2006.01) |
| B60J 11/00 | (2006.01) |
| B64C 21/10 | (2006.01) |

(52) U.S. Cl.
CPC ............ *H05K 9/0081* (2013.01); *B60J 11/00* (2013.01); *B64C 21/10* (2013.01); *B64C 2230/12* (2013.01)

(58) Field of Classification Search
None
See application file for complete search history.

(56) References Cited

U.S. PATENT DOCUMENTS

| 9,748,015 | B2 | 8/2017 | Mrozek et al. |
| 10,032,538 | B2 | 7/2018 | Shumaker et al. |
| 10,304,604 | B2 | 5/2019 | Lazarus et al. |
| 10,553,342 | B2 | 2/2020 | Lazarus et al. |
| 2019/0250315 | A1* | 8/2019 | Boriskin ............ H05K 9/0081 |

OTHER PUBLICATIONS

Manufacturing Engineering and Technology, 6th Ed. by Serope Kalpakjian, Steven R. Schmid, Hamidon Musa; Pearson Education (2009), Chap. 16, p. 398.

(Continued)

*Primary Examiner* — Jeffrey D Washville
(74) *Attorney, Agent, or Firm* — Eric B. Compton

(57) ABSTRACT

A highly-conformal, pliable thin electromagnetic (EM) skin for altering at least one electromagnetic property of a surface includes a pliable thin film, and sub-wavelength elements incorporated into and/or on the pliable thin film which are smaller in scale than the wavelengths of electromagnetic radiation they are intended to influence. The electromagnetic skin readily conforms to contours of a surface to which it attaches or otherwise adheres to. Such electromagnetic skin can be used to cover various surface and platforms on equipment, walls, vehicles, and aircraft to change the electromagnetic properties of such surfaces to achieve certain functions that are not achievable with simple ground plane surfaces. The EM skin may be judiciously configured to alter at least one electromagnetic property of the surface by blocking, absorbing, enhancing, and/or bending waves of electromagnetic radiation.

23 Claims, 20 Drawing Sheets

(56) References Cited

OTHER PUBLICATIONS

Lai, Chen, and Yen, "Creating negative refractive identity via single-dielectric resonators," Optics express, 17(15), Jul. 20, 2009, p. 12960-12970.
Jahani and Jacob, "All-dielectric metamaterials," Nature nanotechnology, 11(1), 2016.
Staude et al., "Tailoring directional scattering through magnetic and electric resonances in subwavelength silicon nanodisks," ACS nano, 7(9), 2013 pp. 7824-7832.
Wang et al., "Experimental realization of all-dielectric composite cubes/rods left-handed metamaterial," Journal of Applied Physics, 109(8), 2013, p. 084918.
Gu et al., "A broadband low-reflection metamaterial absorber," Journal of Applied Physics, 108(6), 2010 p. 064913.
Ghosh et al., "Bandwidth-enhanced polarization-insensitive microwave metamaterial absorber and its equivalent circuit model," Journal of Applied Physics, 115(10), 2014, p. 104503.
Singh et al. "Single and dual band 77/95/110 GHz metamaterial absorbers on flexible polyimide substrate." Applied Physics Letters, 99(26), 2011, p. 264101.
Xiaojun Huang, Dong Yang, and Helin Yang, "Multiple-band reflective polarization converter using U-shaped metamaterial," J. Appl. Phys. 115, 103505 (2014).
Grady, N.K., et al. "Terahertz metamaterials for linear polarization conversion and anomalous refraction." Science, 340(6138), pp. 1304-1307.
Ma, H.F., Wang, G.Z., Kong, G.S. and Cui, T.J., "Broadband circular and linear polarization conversions realized by thin birefringent reflective metasurfaces," Optical Materials Express, 4(8), pp. 1717-1724.
Q. Nguyen, A.I. Zaghloul, T.K. Anthony, and S.J. Weiss, "Using Multiple Resonances to Widen the Band for High-Permeability Spiral-Pair Metamaterials," IEEE Antennas and Wireless Propagation Letters, vol. 18. No. 5, May 2019.
A.I. Zaghloul, Q. Nguyen, S.J. Weiss, "Study on High Permeability Flexible Metamaterial Structures with Very Small Thickness," Tri-Service Metamaterial Review, Invited, Arlington, Virginia, Nov. 2016.
Q. Nguyen, A.I. Zaghloul, and S.J. Weiss, "Wide-Band High Permeability Metamaterials," IEEE International Symposium on Antennas and Propagation, San Diego, California, Jul. 2017.
Q. Nguyen, M.J. Mencagli, N. Engheta, and A.I. Zaghloul, "The Constitutive Effective Parameters of Two-Dimensional Multilayered Dielectric Grating Slab," 34th Annual Review of Progress in Applied Computational Electromagnetics, Denver, Colorado, Mar. 2018.
A.I. Zaghloul, Q. Nguyen, T.K. Anthony, S.J. Weiss, and E.D. Adler, "Towards Experimental Verification Of Permeability Upgrading Using Metamaterial Inserts," URSI AT-RASC, Canary Islands, Spain, May 2018.
Q. Nguyen and A.I. Zaghloul, "Impedance Matching Metamaterials Composed of ELC and NB-SRR," IEEE International Symposium on Antennas and Propagation, Boston, Massachusetts, Jul. 2018.
A.I. Zaghloul, Q. Nguyen, T.K. Anthony, S.J. Weiss, and E.D. Adler, "First-Principle versus NRW Retrieval of Metamaterial-Insert Constitutive Parameters Using Measured Scattering Matrix," IEEE International Symposium on Antennas and Propagation, Boston, Massachusetts, Jul. 2018.

* cited by examiner

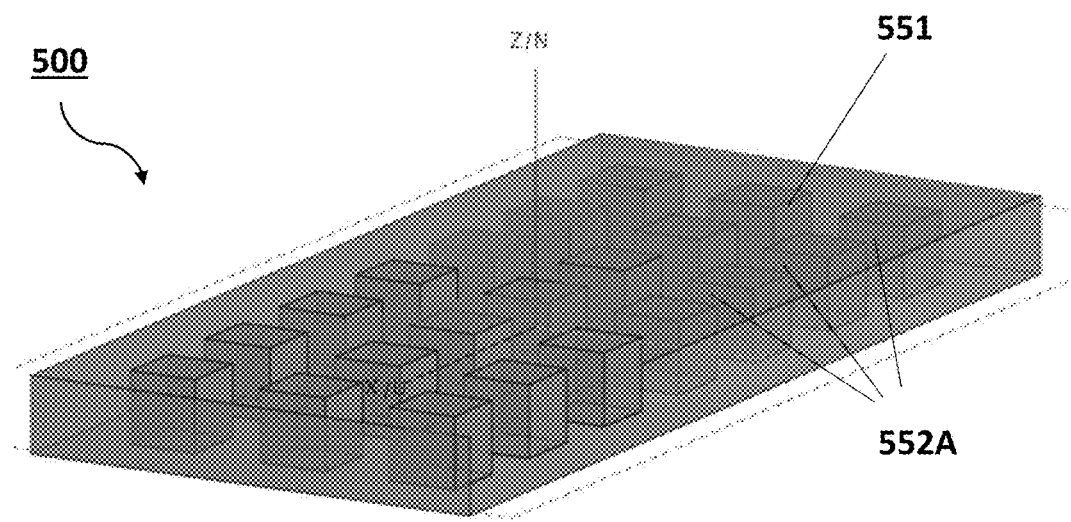
FIGURE 5A
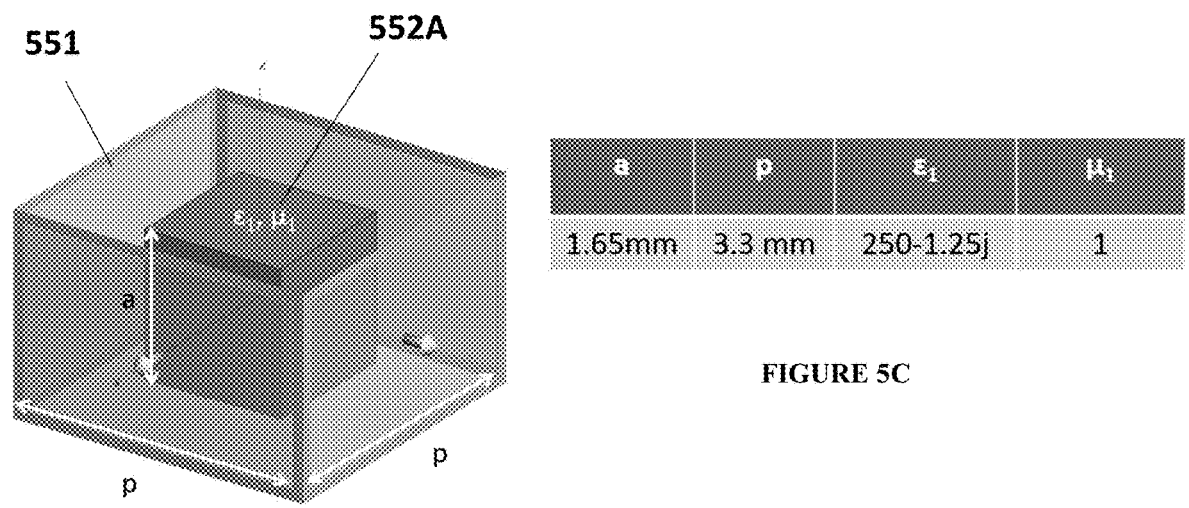
FIGURE 5B
FIGURE 5C

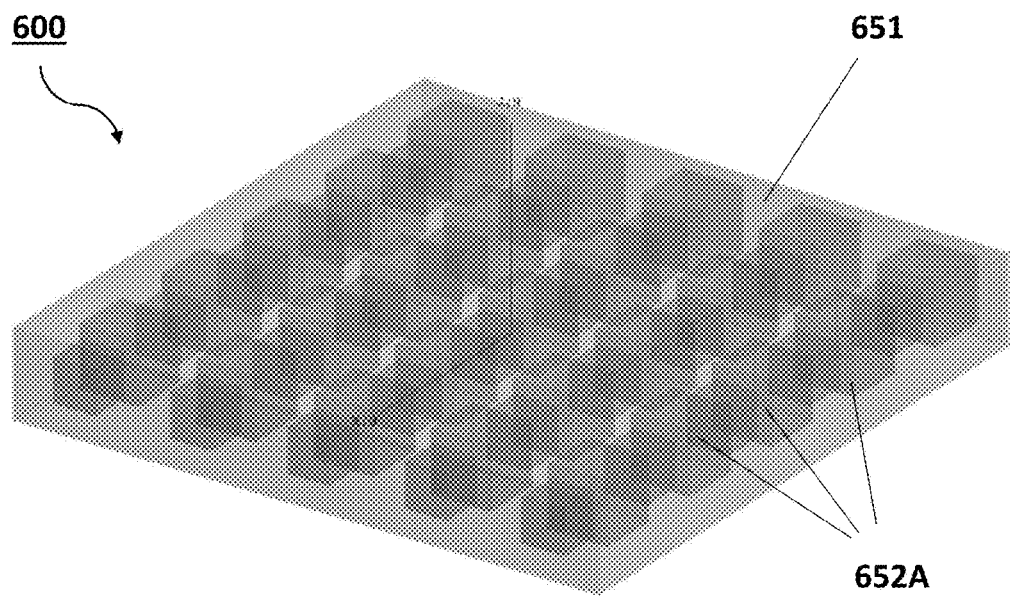
FIGURE 6A
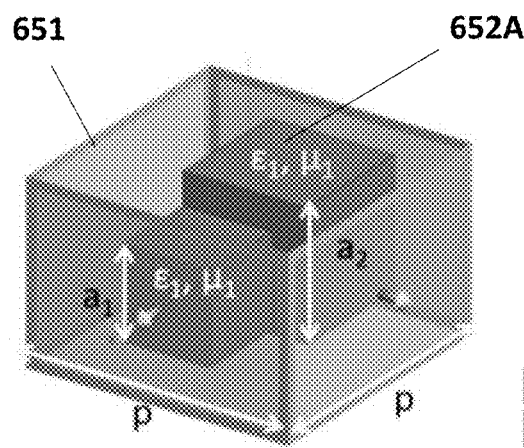
FIGURE 6B
| $a_1$ | $a_2$ | p | $\varepsilon_r$ | $\mu_r$ |
|---|---|---|---|---|
| 1.5mm | 2.0mm | 4.2mm | 294-0.5j | 1 |
FIGURE 6C

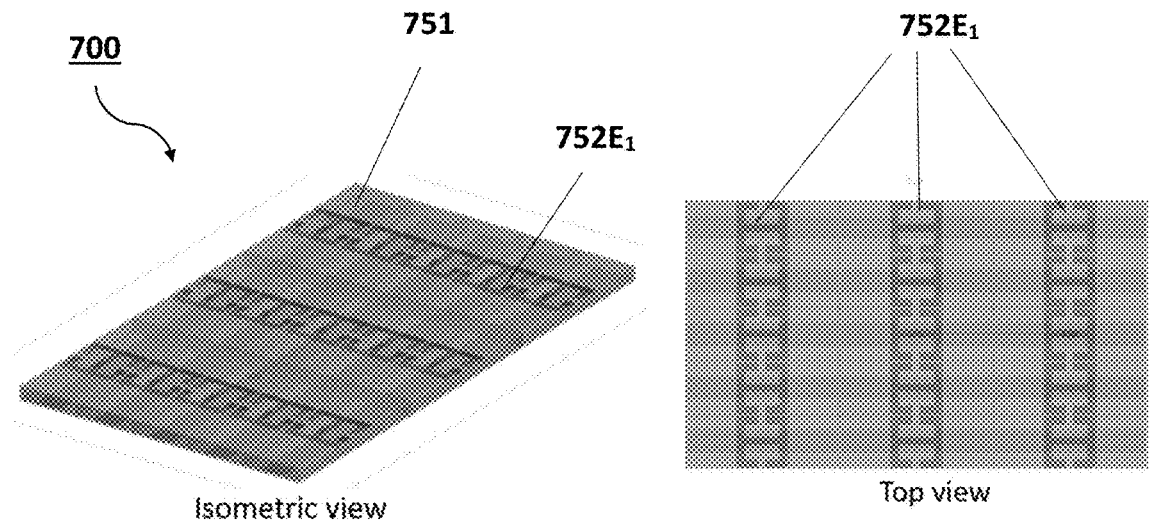
FIGURE 7A
FIGURE 7B
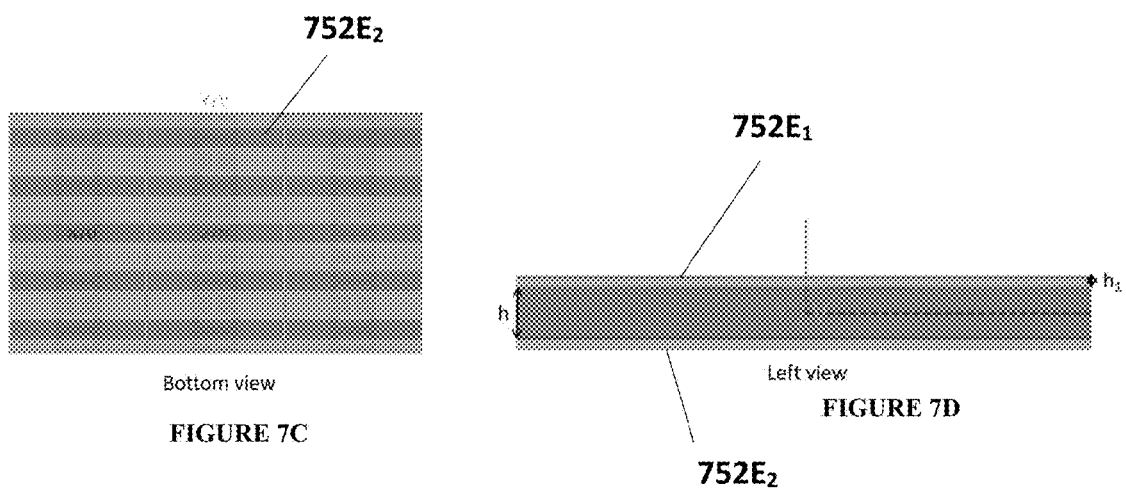
FIGURE 7C
FIGURE 7D

| a₁ | 4.2mm |
|---|---|
| a₂ | 12mm |
| t | 0.6mm |
| G | 0.6mm |
| W | 4mm |
| L | 1.7mm |
| H | 11.8mm |
| h | 0.72mm |
| h₁ | 0.15mm |

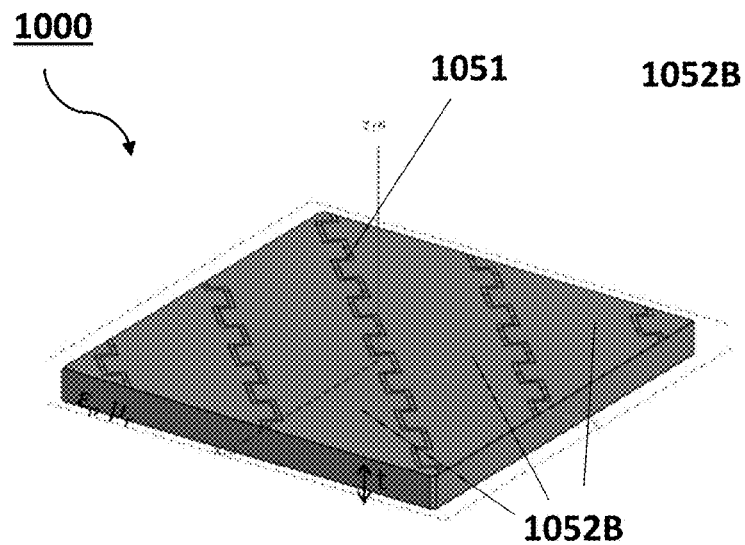
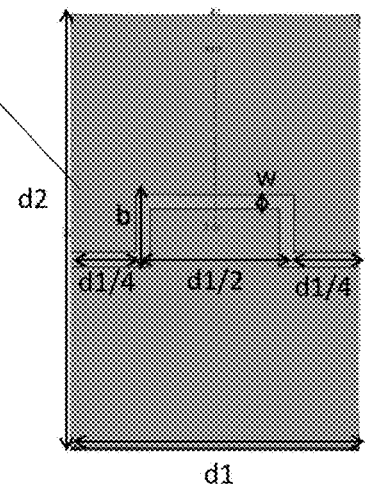
FIGURE 10A
FIGURE 10B
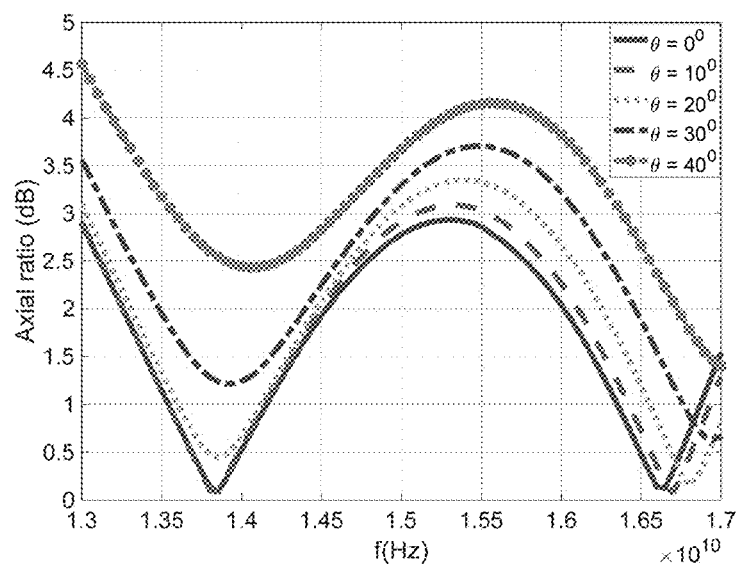
FIGURE 10C
FIGURE 10D

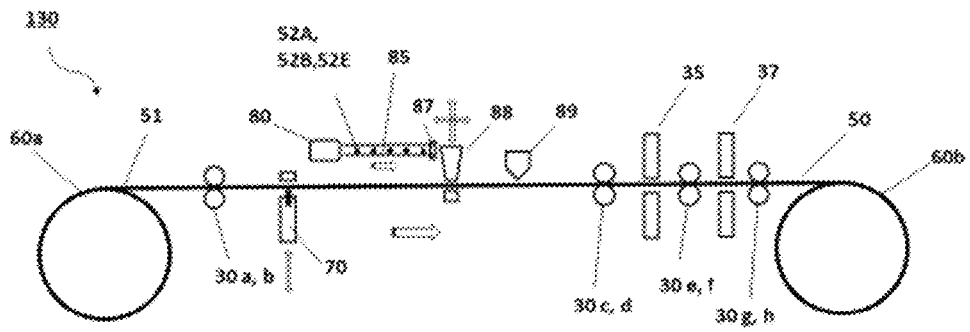
FIGURE 12C
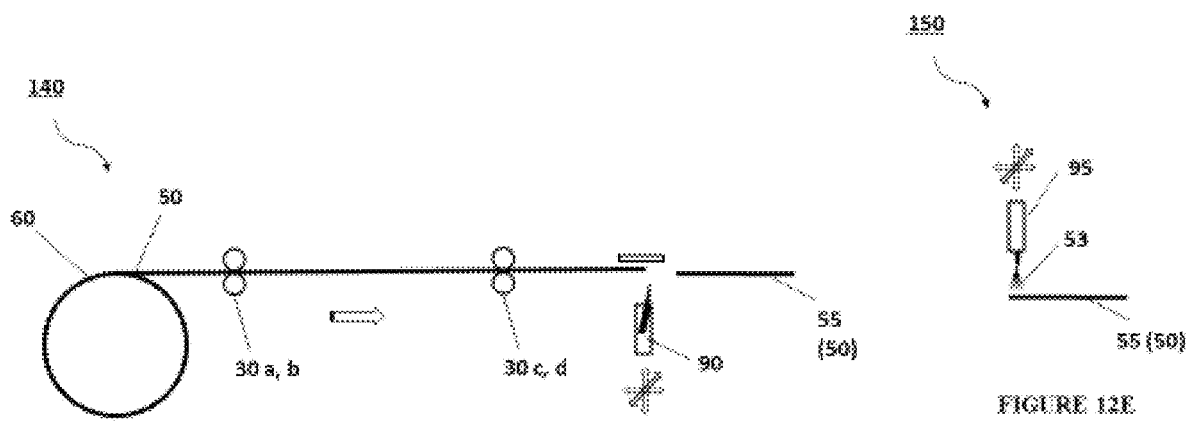
FIGURE 12D
FIGURE 12E

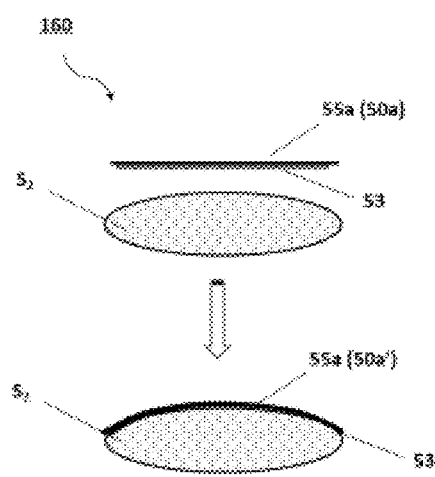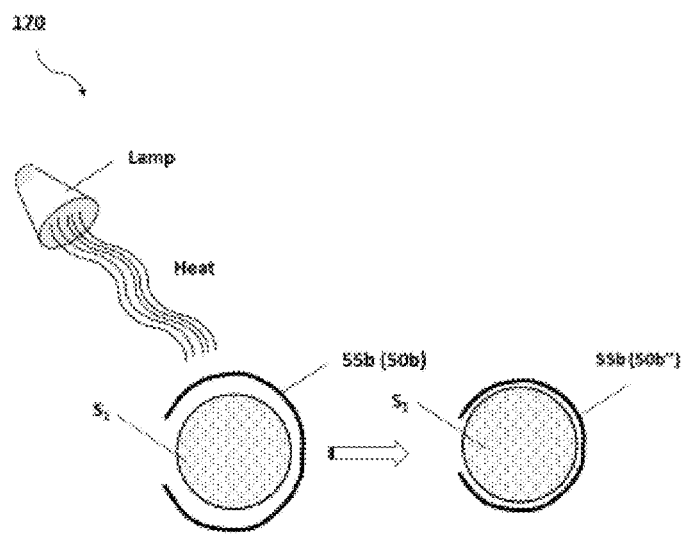
FIGURE 13A
FIGURE 13B

HIGHLY-CONFORMAL, PLIABLE THIN ELECTROMAGNETIC SKIN

GOVERNMENT INTEREST

The invention described herein may be manufactured, used, and licensed by or for the United States Government.

BACKGROUND OF THE INVENTION

I. Field

The present invention relates generally to altering to electromagnetic properties, and more particularly to, a highly-conformal, pliable thin electromagnetic skin.

II. Description of Related Art

Most external surfaces of vehicles, aircraft, equipment or platforms/walls are made of materials that are primarily conducting, like metals. The electromagnetic properties of such surfaces are generally reflective with 180-degree phase shift and zero transmission. They satisfy the mechanical, structural, and thermal requirements, and provide the electromagnetic basis for the design of components that are mounted above them. The surfaces can be made to exhibit additional properties. Currently-available means that provide the required properties have higher-profile, use rigid material, and cover smaller areas that do not necessarily include the whole platform. Some of the properties of presently known devices are valid only at low frequencies (e.g., UHF or less).

SUMMARY OF THE INVENTION

According to embodiments, there is provided a highly-conformal, pliable thin electromagnetic (EM) skin for altering at least one electromagnetic property of a surface. The EM skin includes a pliable thin film, and sub-wavelength elements incorporated into and/or on the pliable thin film which are smaller in scale than the wavelengths of electromagnetic radiation they are intended to influence. The electromagnetic skin readily conforms to contours of a surface to which it attaches or otherwise adheres to.

Such electromagnetic skin can be used to cover various surfaces and platforms, like equipment, walls, vehicles, and aircraft, and to change the electromagnetic properties of such surfaces to achieve certain functions that are not achievable with simple ground plane surfaces. The EM skin can cover the whole platform, part of the surface platform, or cover multiple sections to serve a number of functions at different locations and/or at different frequencies.

The electromagnetic skin according to embodiments may be judiciously configured to alter at least one electromagnetic property of the surface by blocking, absorbing, enhancing, and/or bending waves of electromagnetic radiation. The electromagnetic properties may include, but are not limited to: high impedance, high permeability, matching to free-space, energy absorbing with no reflection, reflection with different phases, polarization transforming, electromagnetic shielding, and minimum scattering. Thus, the electromagnetic skin may be configured to provide high impedance, high permeability, matching to free-space, energy absorbing with no reflection, reflection with different phases, polarization transforming, and electromagnetic shielding.

More particularly, in some non-limiting embodiments, the electromagnetic skin is configured to alter electromagnetic radiation in the frequency range of about 8.0-12.0 GHz. In others, the electromagnetic skin is configured to alter electromagnetic radiation in the microwave frequency range of about 0.3-300 GHz. These exemplary frequency bands may be wide enough from the practical point of view for many applications, but there may be no frequency bounds for other embodiments of the EM skin. The pliable thin film may have a dielectric constant or relative permittivity Cr of at least 2.9 and low loss tangent of less than 0.2 at microwave frequency range. These exemplary permittivity ranges may be practical for many applications, but other EM skin embodiments may be have no limitations in terms of permittivity.

The thin pliable film may be a polymer-based material in some embodiments. To maintaining conformity of the electromagnetic skin to the surface, the pliable thin film may be 1-2 mm or less in thickness. The thin pliable material may be embedded and/or coated with nanoparticles and metamaterial inserts, or other components that fit within or on the surface of the thin material, to facilitate such electromagnetic properties. The sub-wavelength elements may include, but are not necessarily limited to: material inserts, metamaterials inserts, nanoparticles, flakes and/or functional inserts. In some embodiments, the materials inserts may be arranged in a regular repeating pattern in the EM skin. For instance, the material inserts may be configured as one or more of the following: a sphere, cube, cylinder, hexagon, donut, prism or disk.

Depending on the desired function to be imparted to the surface, in some embodiments, the electromagnetic skin may not include a ground plane surface. In order to adhere the electromagnetic skin to the surface, in some embodiments, the may be provided an adhesive for attaching the skin to a surface. The adhesive may be a permanent or a self-adhesive for instance. In others embodiments, the pliable film can be a heat-shrinkable material so as to readily conform to the surface with the application of sufficient heat.

The EM skin can be readily configured for various surfaces. Exemplary surfaces might include equipment, a wall, a vehicle or an aircraft.

Methods of fabricating the EM skin and attaching the EM skin to a surface are also described.

These and other embodiments of the invention are described in more detail below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

FIGS. 5A-5F show an electromagnetic skin and performance characteristics for Example 1, a thin surface for high-permeability/high-impedance/low-loss at high RF frequencies using metamaterials, according to an embodiment.

FIGS. 6A-6E show an electromagnetic skin and performance characteristics for Example 2, a thin surface with impedance matched to free space and high permittivity and high permeability, according to an embodiment.

FIGS. 7A-7G show an electromagnetic skin and performance characteristics for Example 3, a thin surface for energy absorbance at RF, according to an embodiment.

FIGS. 10A-10D show an electromagnetic skin and performance characteristics for Example 6, a thin surface for reflection polarization conversion, according to an embodiment.

FIGS. 12A-12E show various processing lines which may be used in the fabrication of the electromagnetic skin according to embodiments.

FIGS. 13A and 13B show two attachment methods for attaching EM skin to a contoured surface according to embodiments.

DETAILED DESCRIPTION

A highly-conformal, pliable thin electromagnetic skin and embodiments thereof are now described. This electromagnetic skin may be also referred to as "EM skin," or simply "skin" for short herein. In general, the electromagnetic skin is used to cover surfaces and platforms to alter or change the electromagnetic properties of such surfaces to achieve certain functions that are not achievable with simple ground plane surfaces. It may be formed of a thin pliable film material embedded with sub-wavelength elements. The electromagnetic properties may include, but are not limited to: high impedance, high permeability, matching to free-space, energy absorbing with no reflection, reflection with different phases, polarization conversion, and electromagnetic shielding. The electromagnetic skin can cover a platform, partially or wholly, or cover multiple sections thereof to serve a number of functions at different locations and at different frequencies. Changing the properties of vast surfaces of equipment and moving platforms will have major operational and financial impacts.

Figure 1A:
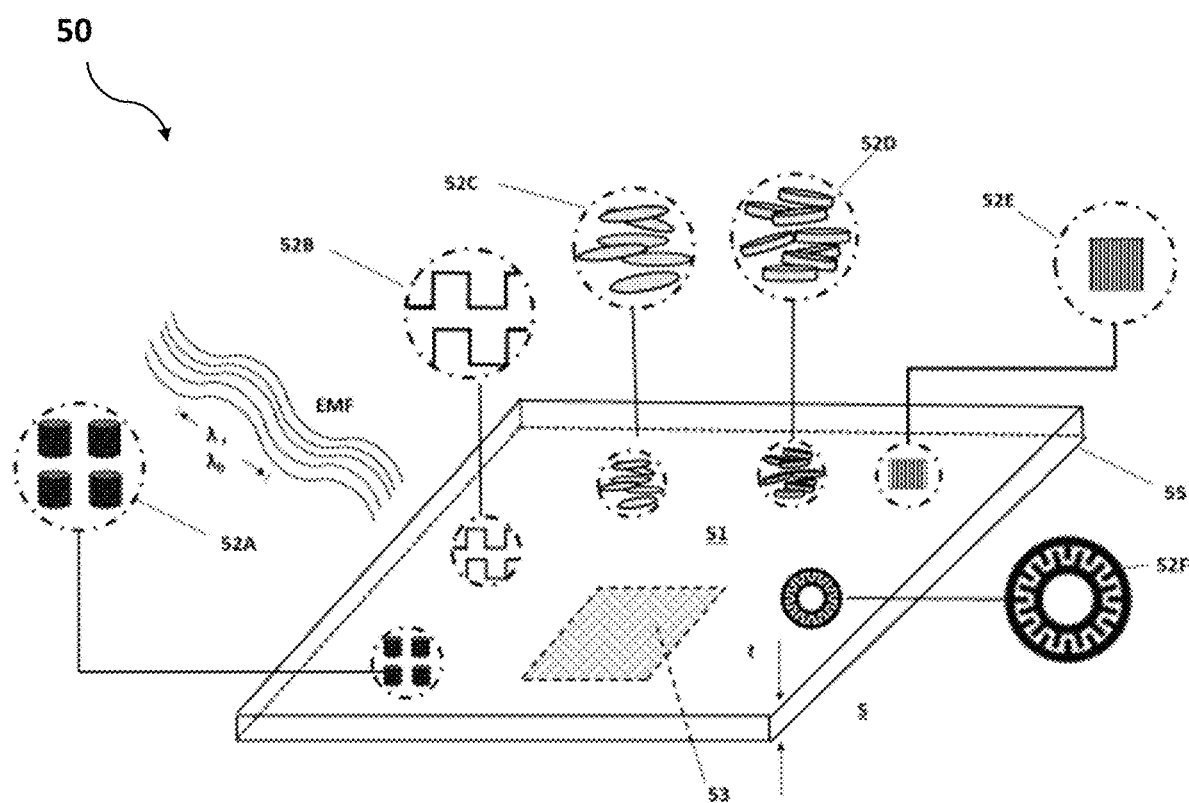
FIG. 1A is a schematic of an electromagnetic (EM) skin according to embodiments of the present invention.

FIG. 1A is a schematic of an electromagnetic skin 50 according to embodiments of the present invention. The EM skin 50 is configured to alter or change the surface electromagnetic properties of equipment, vehicles, or aircraft, to function in a fashion that is different than the normal ground plane surface. The altered EM properties may include, for instance, controlling reflection parameters, such as impedance, magnetic properties, reflection phase, and/or polarization. More particularly, examples of the electromagnetic properties include, but not limited to: high impedance surface, high permeability at different frequency bands, surfaces matched to free-space, energy absorbing surface (no reflection), reflective surfaces with different phases, polarization transforming surfaces, and EM shielding surfaces. The EM skin 50 can cover a surface S, nominally identified as the surface of the page in the figure, platform or cover multiple sections to serve a number of functions at different locations and at different frequencies. In some embodiments, the EM skin 50 can be multi-sectional to serve a number of functions at different frequencies, or extended over large area on the platform to serve one function. This can be achieved using one or multiple sections 55 of EM skin 50.

A basic constituent of the structure of the EM skin 50 is a pliable thin film 51. The pliable thin film 51 acts as a scaffold for the EM skin 50. In general, the thickness t of the EM skin 50 is preferably less than about 2 mm, and in some cases less than about 1 mm, so as to be readily capable of flexibly bending and being highly conformal to surface contours. The length and width of the thin film 51 may be made to any desired area and/or for manufacturing purposes, such as to be stored on a roll of standard dimension. The thin film 51 may be formed of various pliable polymer films, such as formed of thermoplastic and thermosetting polymers. The pliable thin film material 51 may be rolled or spooled before, during or after production of the EM skin 50 depending on the fabrication processing techniques employed. It might be also formed as a flat sheet, although, this make handling large area pieces more difficult. The EM skin 50 may be cut into section 55 of desired size/area.

The electromagnetic skin is formed of a pliable thin film in which sub-wavelength elements are incorporated into and/or on the pliable thin film. The electromagnetic skin readily conforms to contours of a surface to which it attaches or adheres. While the terms "pliable" and "flexible" may be used somewhat interchangeably by some, we believe that they concern varying degrees of elasticity and bendability is worth noting here with respect to the invention. Many conventional semiconductor substrates (like silicon) have some degree of flexibility, which may bend or flex to a limited degree. However, more is needed for EM skin embodiments of the present invention. Indeed, we use "pliable" herein to mean having significant flexibility in terms being bent, formed, and/or shaped. This is much more than conventional semiconductor substrates might provide. This advantageously enables the EM skin according to embodiments to be easily bent around various corners and edges (e.g., acute, 90° and obtuse angles). Moreover, by "thin," as used herein, we mean less than about 2 mm in thickness.

There is an inverse relationship between bendability and the tensile reduction of the area of the material. The minimum bend radius, R, may be approximated as follows:

$$R = T\left(\frac{50}{r} - 1\right), \tag{1}$$

where r is the tensile reduction of area of the sheet metal, T is the thickness. (*Manufacturing Engineering and Technol-*

*ogy*, 6th Ed. by Serope Kalpakjian, Steven R. Schmid, Hamidon Musa; Pearson Education (2009), Chap. 16, p. 398, herein incorporated by reference).

A minimum bend radius R of zero means that the sheet can be folded over itself. For thin polymer sheet materials (e.g., less than about 2 mm in thickness), the minimum bend radius R is generally assumed to be zero. According to embodiments of the present invention, though, various sub-wavelength elements are incorporated into and/or the EM skin. These small elements (which may be rigid or less flexible than the film) affect the overall bendability. Thus, different receipt of the EM skin will have different minimum bend radius. We thus assume the minimum bend radius R to be 3T generally for embodiments of the EM skin.

Figure 1B:
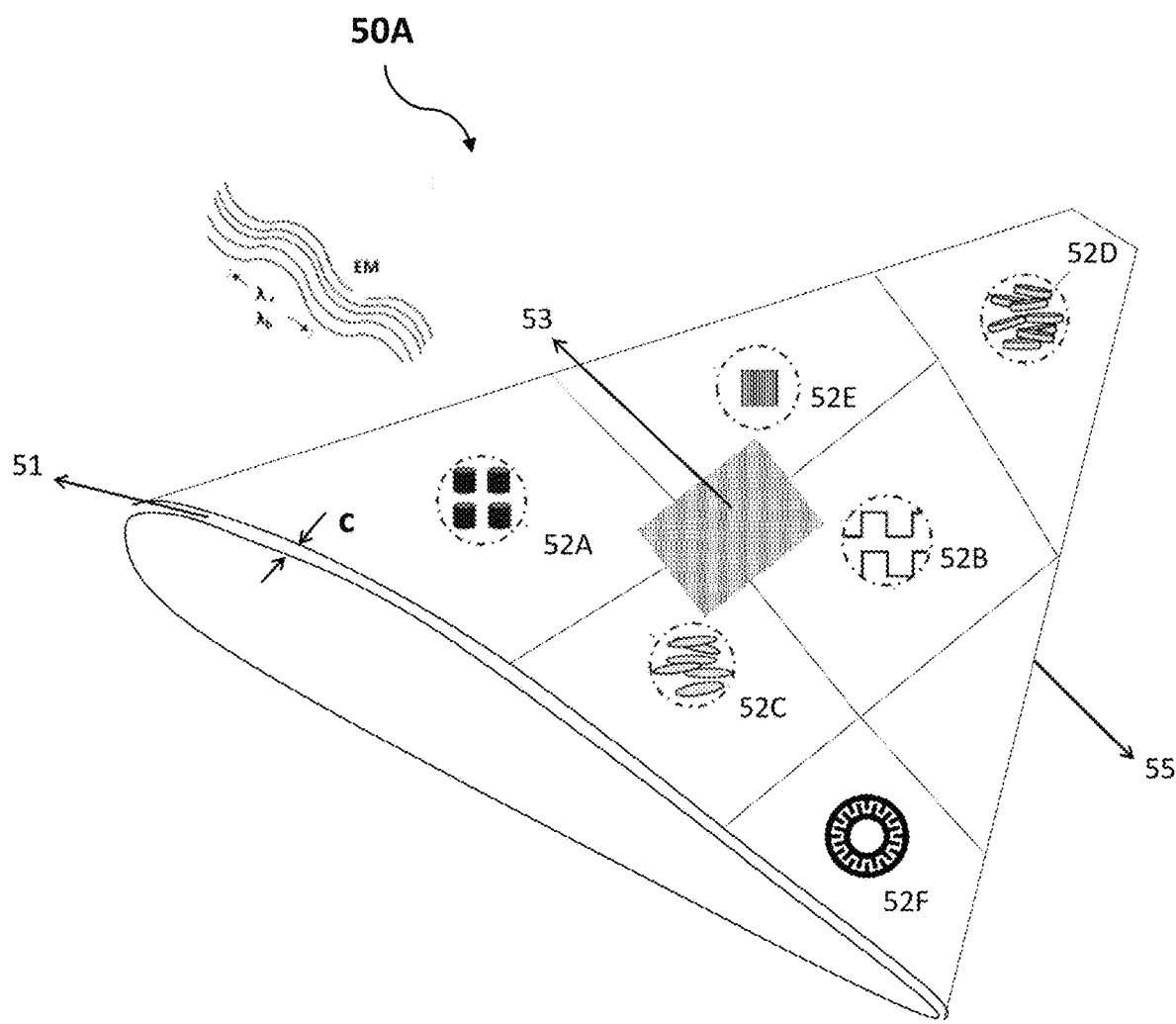
FIG. 1B shows an example of an EM skin attached to an aircraft wing and its conformance to that surface.

Lastly, by "conformal," as used herein, we mean that EM skin can easily conform in shape and/or contour to a surface which is attaches or adheres. In other words, it closely clings and hugs the surface without bunching up and/or leaving space there between. FIG. 1B shows the EM skin 50 attached to an aircraft wing. The surface conformity c of the EM skin as applied may be within a few micrometers, such as less than 10-20 μm as an exemplary tolerance range.

The pliable thin film 51 should preferably be non-conducting. In some embodiments, the pliable thin film material 51 is a polymer-based material, such as a thermoplastic or thermoset plastic or polymer. Suitable thermoplastics for the pliable thin film material 51 may include, but are not limited, to any of the following: acrylic, acrylonitrile butadiene styrene (ABS), polyamides, polylactide (PLA), polybenzimidazole (PBI), polycarbonate (PC), polyester sulfone (PES), polyoxymethylene (POM), polyether ether ketone (PEEK), polyeltherimide (PEI), polyethylene (PE, and various densities thereof, such as UHMWPE, HDPE, MDPE, and LDPE), polyphenylene oxide (PPO), polyphenylene sulfide (PPS), polypropylene (PP), polystyrene (PS), polyvinyl chloride (PVC), polyvinylidene fluoride (PVDF), fluorinated ethylene propylene (FEP) and polytetrafluoroethylene (PTFE). Suitable thermosetting polymers for film 51 may include, but are not limited, to any of the following: polyester resin, polyurethane, polyurea, polyurethane urea, various vulcanized rubbers, polyimide, silicone resins and rubbers, and vinyl esters. Various additives may be included in the polymers for added mechanical and structural properties, like strength. Additives may also be for added electrical or magnetic properties, like desired permittivity or permeability parameters.

In some embodiments, the host polymer of the film material 51 may have a low dielectric constant or relative permittivity $\varepsilon_r$ (e.g., 2-5) and low loss tangent (e.g., <0.2) at microwave frequency.

EMF could be incoming to the surface S, outgoing from the surface S, or perhaps some combination thereof.

The EM skin 50 may be particularly useful and appropriately configured for radio frequency (RF) spectra of the EMF spectrum, especially for RF frequencies of UHF and above. Commercial ultra-high frequency (UHF) has a range from 300 MHz (wavelength 1 m) to 1 GHz (wavelength 30 cm), in embodiments. The EM skin 50 may be particularly configured and advantageous for microwave EMF radiation in some embodiments. The microwave frequency range is typically defined between 1 GHz (wavelength 30 cm) and 300 GHz (wavelength 1 mm). The X-band, in a sub-band and has a frequency range of about 8.0-12.0 GHz (wavelengths of about 3.75-2.5 cm), which may be of interest in other embodiments.

In addition, in some embodiments, an adhesive 53 may be provided on a surface of the thin film 51 for attaching the electromagnetic skin 50 to a surface S. The adhesive 53 may be a permanent or a self-adhesive applied as a thin layer to the bottom surface of the film 51, such as 3M Super 77 Multipurpose Permanent Spray Adhesive Glue or Krylon K07020007 Easy Tack Repositionable Adhesive Spray, as non-limiting examples. Typically, adhesive 53 would be applied to a part or the whole of a surface of the film 51, such as on the bottom surface. Like the thin film 51, the adhesive material 53 may have a low dielectric constant and low loss tangent at microwave frequency range.

Other mechanisms and means to attach the EM skin 50 to the host surface S are possible in other embodiments, such as, by using heat shrinkable material for film 51 as an example. For instance, the heat-shrinkable polymer may be formed of a suitable thermoplastic material such as from polyolefin, fluoropolymer (e.g., FEP or PTFE), PVC, neoprene or silicone elastomer. It may be cross-linked, for instance, using radiation, electron beams, and/or chemicals to create a material memory. To form, the material is heated to just above the polymer's crystalline melting point, expanded, and then rapidly cooled. When the material is later heated above the crystalline melting point of the material, for instance, by an end user, the material will shrink back to its original size. In the case of thin film, the heat shrink material will conform to the shape and contours of surfaces to which it is applied when heated.

Within the thin pliable film material 51, are embedded sub-wavelength elements 52, which are provided to alter electromagnetic properties of electromagnetic frequency (EMF) radiation having one or more frequencies or wavelength and/or one or more frequency bands centered around a wavelength $\lambda_b$. More particularly, sub-wavelength elements 52 can be implanted, impregnated, injected, embedded, bonded, attached, or otherwise incorporated into and/or on the pliable thin film material 51.

The pliable thin film 51 attaches to the surface S. The surface S may be the outer or external surfaces of equipment, buildings, vehicles, or aircraft, for instance. In general, the ultra-thin electromagnetic skin 50 should not affect the mechanical properties of the extended various outer surfaces S of equipment, walls, vehicles, or aircraft. More particularly, it should not significantly diminish, reduce or otherwise diminish the mechanical and aero-nautical (drag) features of the surface S platform. The EM skin 50 adheres to the surface S, preferably without any penetrating parts into the conducting surface in most cases. The EM skin 50 can be passive or active in embodiments depending on the application for a particular section 55.

Figure 1C:
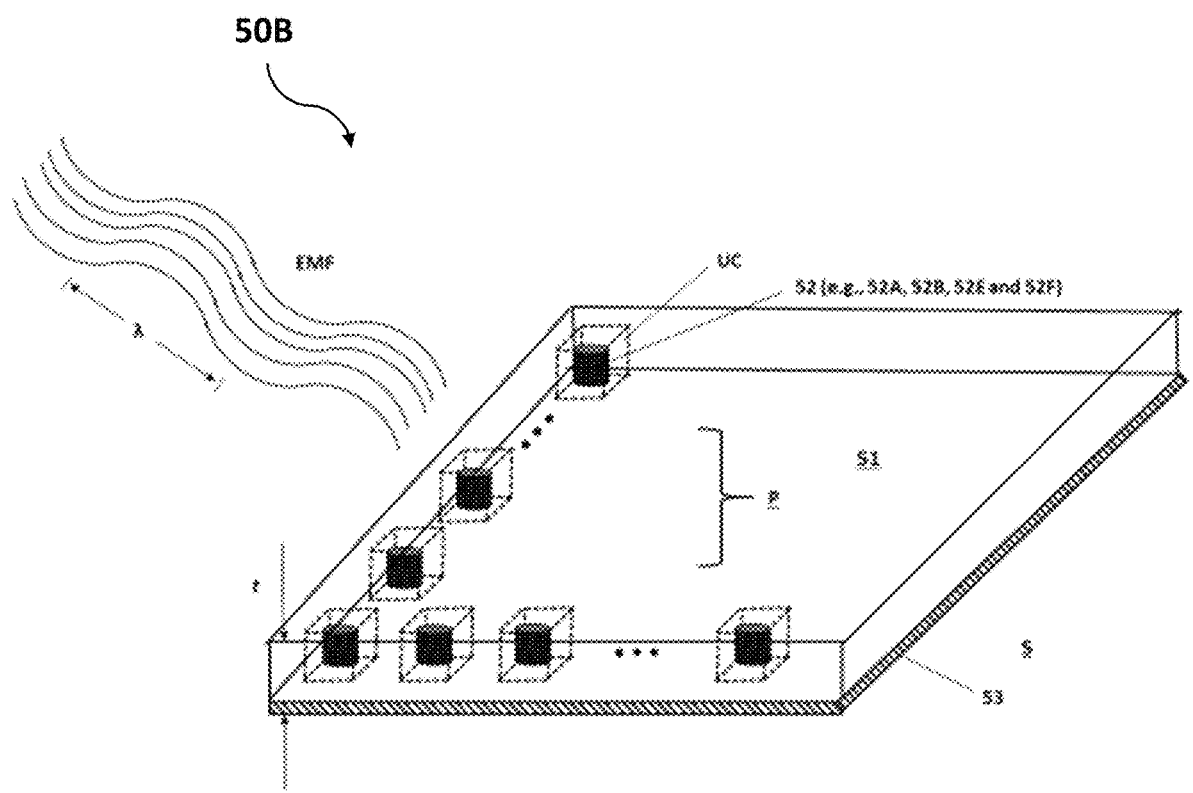
FIG. 1C shows an example of an EM skin in which certain sub-wavelength elements are arranged in regular repeating units and/or patterns.

The sub-wavelength elements 52 may include, for instance, but are not limited to, one or more of the following: metamaterials inserts 52A, printed-circuit meanderline 52B, nanoparticles 52C, flakes 52D, and/or functional inserts 52E and 52F. (Note: FIGS. 1A, 1B, and 1C are not to scale, but include enlarged views showing greater details of these various sub-wavelengths elements, as to how they may be provided within the pliable film material 51 in non-limiting embodiments).

According to embodiments, the certain elements, such as sub-wavelength elements, 52A, 52B, 52 E and 52F may be arranged in regular repeating units and/or patterns, individually known as a "unit cell" and usually smaller in scale than the wavelengths of electromagnetic radiation they influence. An exemplary square pattern P for unit cells UC for elements 52 is shown for EM skim 50B in FIG. 1C. Other EM skin embodiments may have various other 2D or 3D patterns of unit cells (e.g., circular, rectangular, oval, cubic, etc.).

Metamaterials inserts 52A or 52B are formed of metamaterial. As used herein, a "metamaterial" is a material having a property with respect to electromagnetic radiation that is not found in naturally-occurring materials. Put another way, it is an engineered or designed material. In some case, the metamaterial may be formed of multiple materials and/or elements, known as a composite assembly or structure. Metamaterials typically derive their properties, not necessarily from the properties of the base materials, but from their designed structures. Their precise shape, geometry, size, orientation and/or arrangement may give them properties capable of manipulating electromagnetic waves, for example, by blocking, absorbing, enhancing, or bending waves.

Dielectric materials used in metamaterials are high-index semiconducting materials, such as silicone, germanium, or tellurium, and high-index ceramic material, such as barium strontium titanate ($Ba_{1-x}SaTiO_3$) or strontium titanate ($SrTiO_3$), as just a few non-limiting examples.

Inserts 52A include discrete, individual metamaterial elements which are each of a sub-wavelength size. They may be arranged in a regular, repeating pattern. The pattern may be a 2-D or 3-D rectilinear grid, but other patterns (such as, circular, elliptical, hexagonal, etc.) may also be used. Inserts 52B include one or more metamaterial elements, each having a repeating sub-pattern which is of a sub-wavelength size.

Nanoparticles 52C or flakes 52D may be formed of ferromagnetic or ferroelectric materials. They may have sub-wavelength dimensions of the nanometer or micrometer scale. Nanoparticles 52C can be spherical, ellipsoidal, etc. Flakes 52D may be more disc-like. Both may have regular or irregular shapes. These are non-limiting examples. In some embodiments, nanoparticles 52C and/or flakes 52D may be homogeneously (and randomly) distributed throughout the polymer material of the thin film material 51 such as by mixing. The particle density in the polymer many be adjusted to adjust or optimize properties. In other embodiments, nanoparticles 52C or flakes 52D may be embedded one or both surface like a coating. It might also be possible, to form the film 51 in discrete layers (i.e., a multilayered structure) in which nanoparticles are induced on or more sub-layers.

The functional inserts 52E and 52F may include miniature electronic components, dielectric or printed-circuit metamaterial cells, associated parts, and/or any other function-enhancing inserts. Example miniature electronic components may include antennas, inductors, or photovoltaic (PV) cells. Insert 52E is a PV cell and insert 52F is a circular inter-digitated (CID) metamaterial insert. Given their small size, the voltage/current/power requirements of the electronic components will likely be relatively low. The electronic components preferably do not receive power from the platform surface, but this is not a requirement, and some embodiments may in fact do so. The energy required to power or activate the electronic components can be self-generated, such as PV means. In some further embodiments, deformable wiring or conductive traces might be incorporated into the EM skin 50 as disclosed in U.S. Pat. Nos. 9,748,015 and 10,032,538, herein incorporated by reference in their entities.

The sub-wavelength elements 52 (i.e., 52A-52F) need not be pliable themselves in embodiments, but certainly can be. So long as the thin material 51 is pliable and the sub-wavelength elements 52 do not take up much surface area thereof, the thin material 51 should be permitted to readily conform to the surface S. In some embodiment, the sub-wavelength elements 52 may be formed to be pliable and/or elastic themselves increasing the overall pliability of the EM skin 50. For instance, U.S. Pat. No. 10,304,604 and 10,553,342, herein incorporated by reference, disclose incorporating magnetic powders in an elastomeric polymer matrix to make deformable and stretchable elements. And the aforementioned U.S. Pat. Nos. 9,748,015 and 10,032,538 disclose incorporating conductive elements in an elastomeric polymer to make a stretchable conductors and wires. These techniques may be extended to similar form elastic, stretchable, deformable and/or pliable sub-wavelength elements 52 (i.e., 52A-52E).

Figure 2A:
FIGS. 2A-2F show various angled surface for which a section of electromagnetic skin can be attached according to embodiments.
Figure 2B:
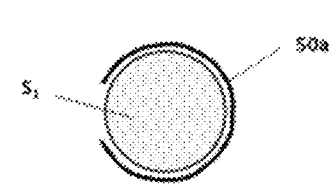
Figure 2C:
Figure 2D:
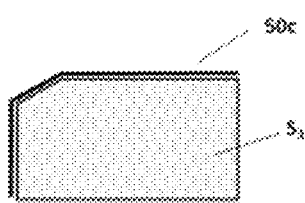
Figure 2E:
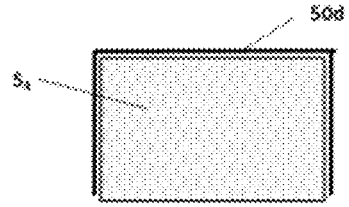
Figure 2F:
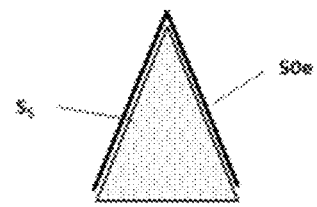

FIGS. 2A-2F show various angled surfaces S for which a section 55 of electromagnetic skin 50 can be attached according to embodiments. FIG. 2A shows a section 55 of EM skin 50. It will need to be sized (e.g., cut to size) for a given surface S. The other figures, FIGS. 2B-2F, show the EM skins 50a, 50b, 50c, 50d, and 50e attached to and readily conforming to the contours of the respective surfaces $S_1$ (circular), $S_2$ (oval), $S_3$ (quadrilateral with angled side), $S_4$ (rectangular with right angles) and $S_5$ (triangular with sharp angle).

Figure 3A:
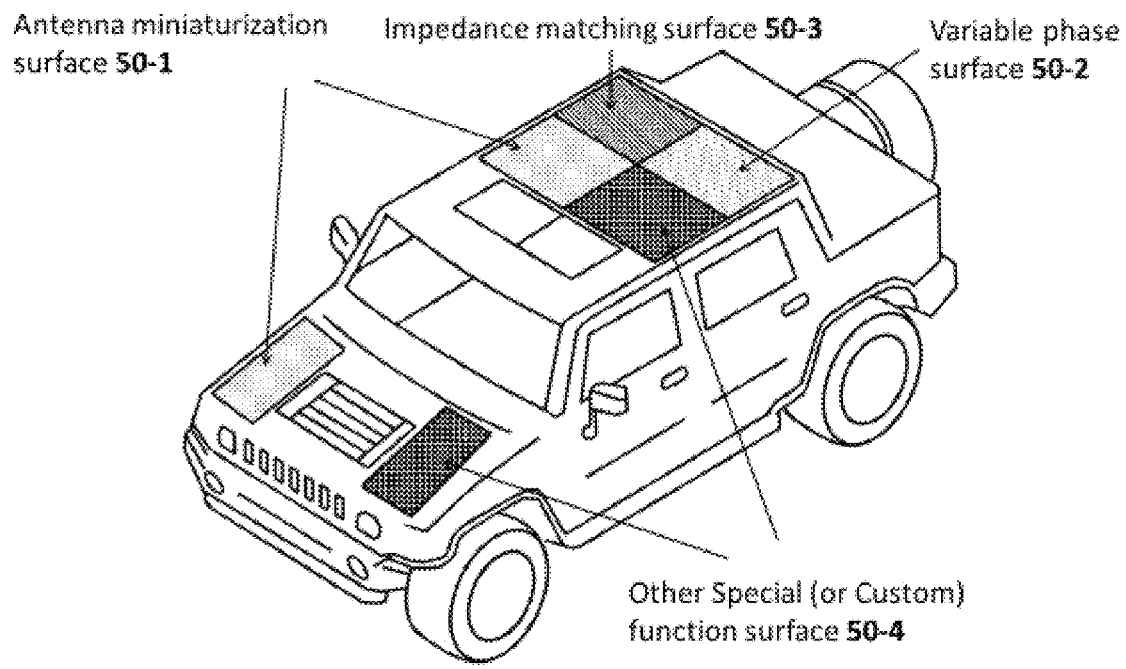
FIGS. 3A and 3B show exemplary layouts of an electromagnetic skin on vehicle platform surfaces that acts as an external skin covering parts of the surface without changing its geometric shape or mechanical structure.
Figure 3B:
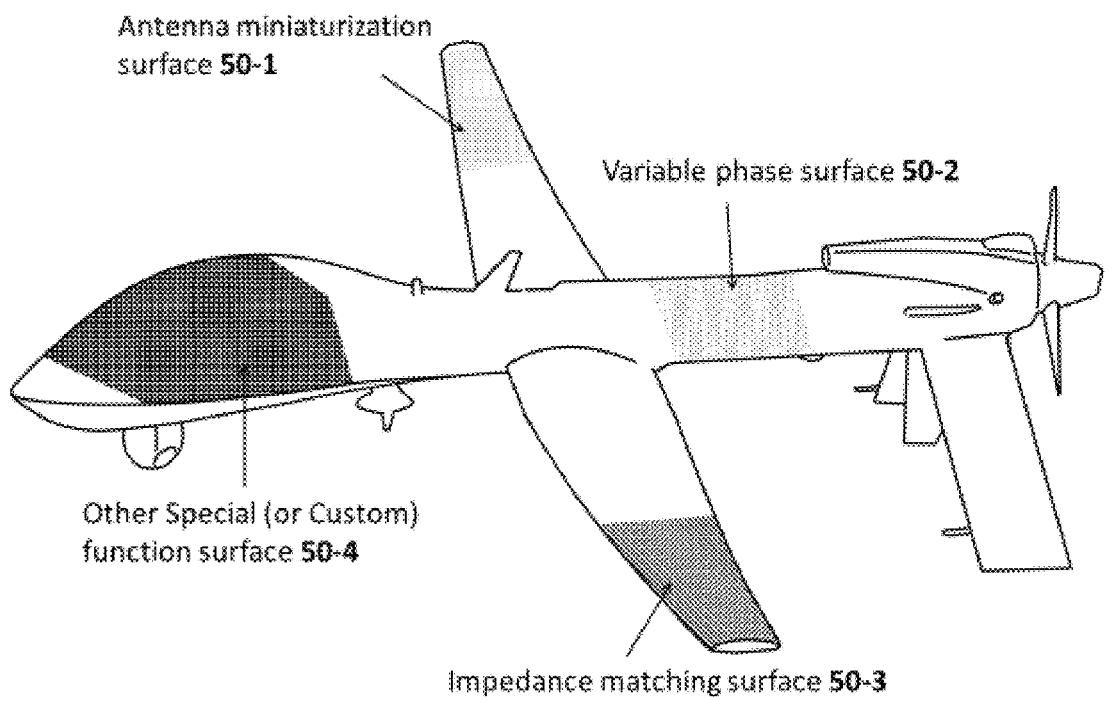

FIGS. 3A and 3B show exemplary layouts of an electromagnetic skin on vehicle platform surfaces that acts as an external skin covering the entirety or parts of the surface without changing its geometric shape or mechanical structure. FIG. 3A shows a ground vehicle, such as a High Mobility Multipurpose Wheeled Vehicle (HMMWV; colloquially known as "Humvee") and FIG. 3B shows an unmanned aerial vehicle (UAV) or drone. These two figure also identify a number of surface functions that may be achieved with embodiments of EM skin 50. These may include: antenna miniaturization surface 50-1, variable phase surface 50-2, and impedance matching surface 50-3, or other special function (or customized) surface 50-4, for instance, as depicted in those figures.

For some applications, the EM skin embodiments can enhance the functions and increase efficiency of planar antennas that are mounted directly above it, saving volume and reducing wind or fluid resistance or drag for antennas on flying platforms. This contributes to the miniaturization of the antenna. Different parts of the EM skin 50 can be designed to achieve different functions, separately, including radar maneuvering, spoofing or deception. The thin EM skin 50, can also be designed for shielding or energy-absorbing purposes. It may have other applications in commercial devices, such as lap-top computers and wireless devices.

Among other possible uses of EM skin 50: a subsurface for planar or conformal antennas, reducing its profile above the platform surface; add features to the aircraft/vehicle perimeters that are useful for radar operations, including deception and friendly detection; adding active functions in the skin by using ultra-thin electronics and solar cell facilities.

Other examples of changing the EM properties of the thin EM skin have been simulated and showed positive results. This includes making the surface match free-space impedance, making the surface absorbing, instead of reflecting, making the surface reflecting with different phase or different polarization.

In some embodiments, the electromagnetic skin 50 may be configured to provide enhancement of magnetic properties, such as, to increase permeability $\mu$. For example, controlling the magnetic properties of a thin surface at frequencies above 2 GHz has been challenging according to the limits enforced by Snoek's law. In brief, Snoek's law limits the frequency beyond which the magnetic material becomes lossy, and the level of permeability above certain frequency. The multiplication of the permeability and such frequency is defined as magnetism and is constant for certain geometrical parameters of the material and its contents. Embodiments of the EM skin can extend Snoek's law realization at high RF frequencies using the control of the particle shape in patterned thin-film form.

The following are some possible applications to adding functional EM skins to ground vehicles and aircraft surfaces: high impedance surface for higher-gain, near-zero profile antennas; matched impedance surface for higher gain, low profile antennas; radar deception surface using reflection phase control, static or dynamic; Digital Radio Frequency Memory (DRFM) surface for radar signal control; radar signal control that is required for vehicles, aircraft, and missiles, or other flying or moving objects; shielding or energy absorption surfaces; and functional active surfaces using solar or other energy-supplying means.

Figures 4A, 4B, 4C:
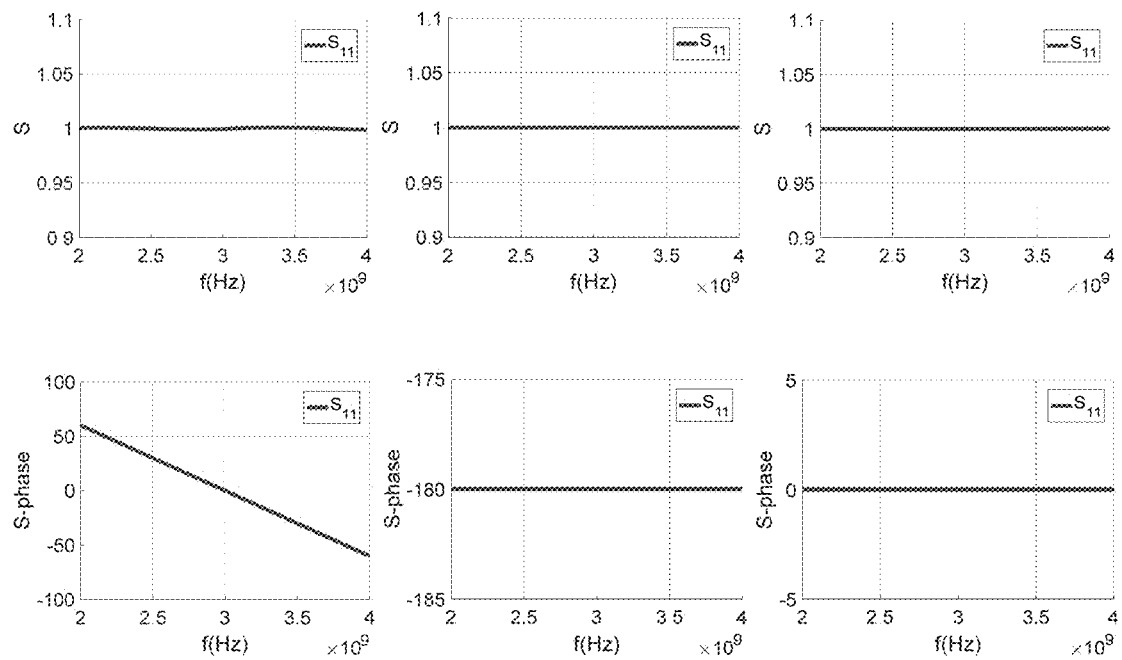
FIGS. 4A-4C show examples of how the scattering parameters of a surface can be changed with surface elements.

FIGS. 4A-4C show examples of how the scattering parameters of a surface can be changed with surface elements. More particularly, the figures shows scattering parameters simulations for (a) a quarter-wavelength slab and two thin material layers with full reflection, and 180° and Zero phase shifts, for (b) a perfect electric conducting (PEC) surface and (c) perfect magnetic conducing (PMC) surface, respectively. The scattering-matrix parameters for these surfaces are shown.

A perfect electric conducting (PEC) surface, which makes up the metallic surface of most conventional vehicular platforms, reflects the signal with 180-degree phase shift. A planar or conformal antenna situated slightly above such surface will have its signal cancelled on axis as a result. An antenna elevated a distance of quarter wave length will have its signal doubled as a result of the additional 180-degree phase shift caused by the additional distance of half wavelength. On the other hand, a perfect magnetic conducting (PMC) surface, produces the same full reflection with 0° phase shift, with doubling the signal strength.

Changing the perfect conducting surface of the conventional platform into a surface that produces other electromagnetic functions is one of the main purposes of the electromagnetic skin 50. The features are primarily reflection parameters if the host surface is a conducting surface, or absorbing parameters in other cases. The EM skin 50 may adhere to the host surface using adhesive layer, which does not affect the performance of EM skin due to its low dielectric constant and low loss tangent.

The following examples of EM skins were analyzed, simulated, and/or built and tested by the inventors:

Example 1: Thin (1.65 mm) Surface for High-Permeability/High-Impedance/Low-Loss at High RF Frequencies Using Metamaterials (FIGS. 5A-5F)

FIGS. 5A and 5B show an electromagnetic skin 500 according to an embodiment. FIG. 5A is an isometric view of EM skin 500 and shows it comprises a pliable thin film 551 with a plurality of embedded metamaterial inserts 552A that functions as high-impedance surface. The pliable thin film 551 may formed of a polymer and be 1.65 mm in thickness. The metamaterial inserts 552A are arranged in a regular repeating pattern. FIG. 5B shows an isometric detailed view of the unit cell of the regular repeating pattern of the metamaterial inserts and one cubic metamaterial insert 552A of the electromagnetic skin 500.

Unlike the ground plane surface that makes up most of the military equipment and vehicles, and has a 180-degree reflection phase, the electromagnetic skin 500 is configured to reflect the signal with zero-phase shift. The metamaterial inserts 552A are formed of dielectric metamaterial that is shaped as a cube. In this EM skin 500, the metamaterial insert 552A is a solid cube formed of strontium titanate. Nominal dimensions are shown on the aforementioned figures and specific dimensions for one exemplary embodiment tested are included in the table of FIG. 5C.

By embedding the metamaterial inserts 552A made by very high dielectric material of $\varepsilon_r$>50 (for example, strontium titanate, $\varepsilon_r$=310), the loop current is created within the dielectric inserts, which leads to magnetic resonances, See, e.g., Lai, Chen, and Yen, "Creating negative refractive identity via single-dielectric resonators," *Optics express*, 17(15), 2009 Jul. 20, p. 12960-70, herein incorporated by reference in its entirety.

While the metamaterial inserts 552A are cubes in the EM skin 500, it will be appreciated that the metamaterial inserts 552A could alternatively be other 3D shapes, such as, but not limited to, a sphere, prim, cylinder or donut. See, e.g., Jahani and Jacob, "All-dielectric metamaterials," *Nature nanotechnology*, 11(1), 2016, herein incorporated by reference in its entirety. Any change of course may alter the performance of the EM skin 500.

Figure 5D:
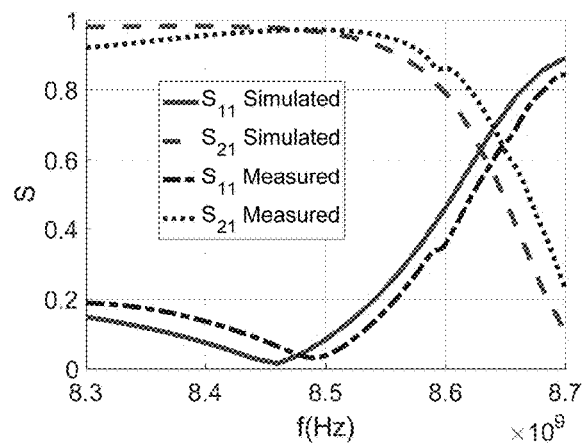
Figure 5E:
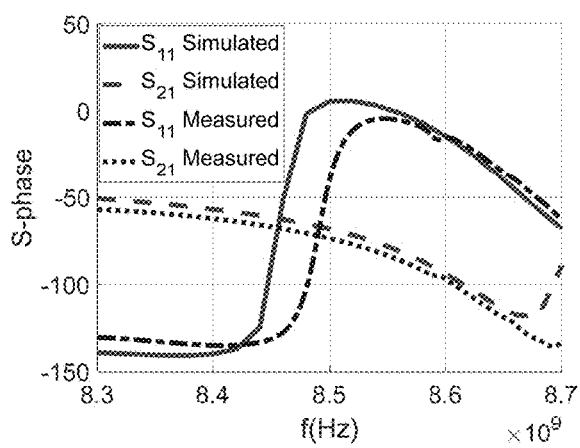
Figure 5F:
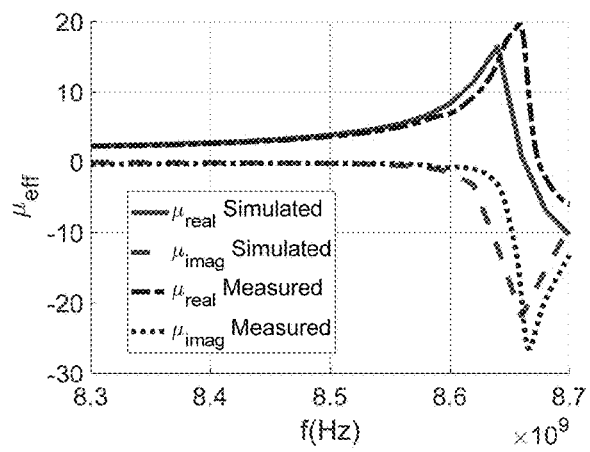

FIGS. 5D-5F are plots showing simulated and measured performance of this EM skin 500 over select frequencies ranging from 8.3-8.7×10$^9$ Hz. FIGS. 5D and 5E show simulation and measured magnitude and phase of scattering parameters, respectively. FIG. 5F shows the relative permeability μ. The retrieved relative permeability of this layer is shown to be around 5, rising to close to 20 around resonance frequency in the X-band. The X-band is electromagnetic radiation in the frequency range of about 8.0-12.0 GHz (wavelengths of about 3.75-2.5 cm).

This result in the EM skin 500 having an increased permeability at RF frequencies with low loss. This also results in a high-impedance surface that reflects the signal with zero-phase shift. These parameters enhance the performance of a planar antenna that is placed directly above the EM skin 500.

Example 2: Thin Surface with Impedance Matched to Free Space and High Permittivity and High Permeability. (FIGS. 6A-6E)

FIGS. 6A and 6B show an electromagnetic skin 600 according to an embodiment. FIG. 6A is an isometric view of EM skin 600 and shows it comprises a pliable thin film 651 with a plurality of embedded metamaterial inserts 652A that functions as an essentially reflectionless or transparent surface with very high refractive index.

The pliable thin film 600 may formed of a polymer and be 2.00 mm in thickness. The metamaterial inserts 652A are arranged in a regular repeating pattern. FIG. 6B shows an isometric detailed view of the unit cell of the regular repeating pattern of the metamaterial inserts and one dual-cubic metamaterial insert 652A of the electromagnetic skin 600.

By using dielectric metamaterial units cells of a dual cube, i.e., two cubes of different sizes arranged in a periodic lattice, the magnetic and electric resonance can be created simultaneously to produce high permeability and high permeability values that are close to each other. Nominal dimensions are shown on the aforementioned figures and specific dimensions for one exemplary embodiment tested are included in the table of FIG. 6C.

While dual cube inserts 652A are used in the EM skin 600, it will be appreciated that other combination 3D shapes such as cubes and square rods, disks can also be used. See, e.g., Staude et al. "Tailoring directional scattering through magnetic and electric resonances in subwavelength silicon nanodisks," *ACS nano,* 7(9), 2013 pp. 7824-7832; and Wang et al., "Experimental realization of all-dielectric composite cubes/rods left-handed metamaterial," *Journal of Applied Physics,* 109(8), 2013, p. 084918, herein incorporated by reference in their entireties, Any change of course may alter the performance of the EM skin 600.

Figure 6D:
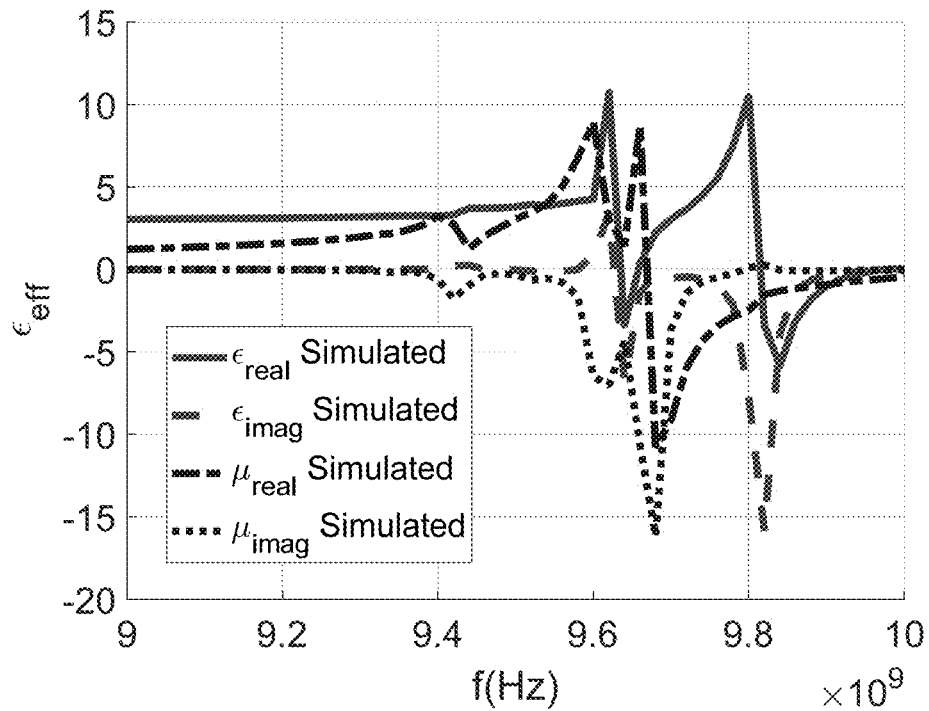
Figure 6E:
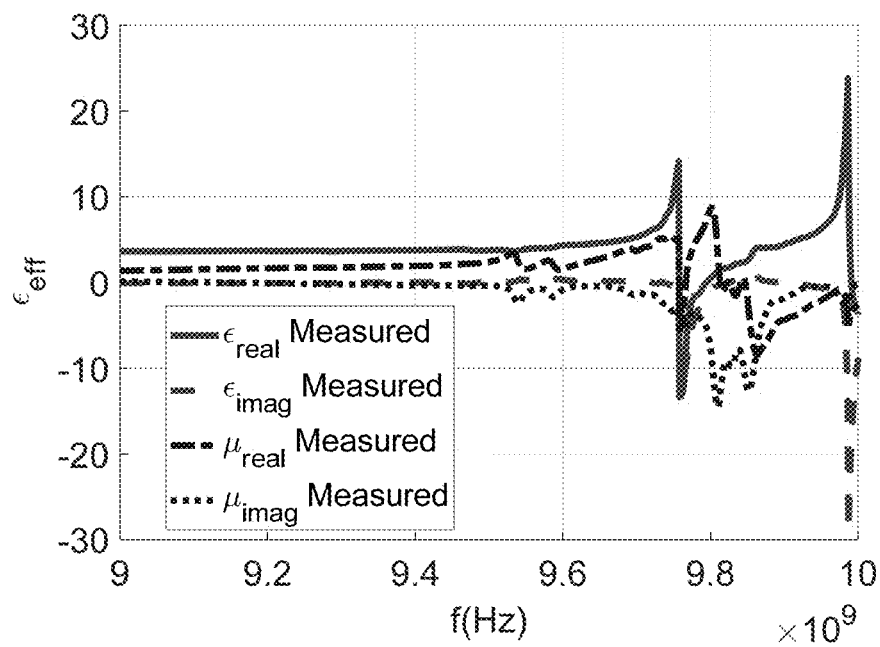

FIGS. 6D and 6E are plots showing simulated and measured performance, respectively, of the EM skin 600 over select frequencies ranging from 9-10×10$^9$ Hz. They show the effective permittivity $\varepsilon$ and effective permeability $\mu$ of closely matched values around the same electric and magnetic resonance frequencies. This produces impedance that is matched to free space, causing no refraction, with reflection off the ground plane under the EM skin with 360-degree phase shift close to the frequency that corresponds to quarter-wavelength thickness of the EM skin 600.

Example 3: Thin (0.87 mm) Surface for Energy Absorbance at RF. (FIGS. 7A-7G)

Figure 7E:
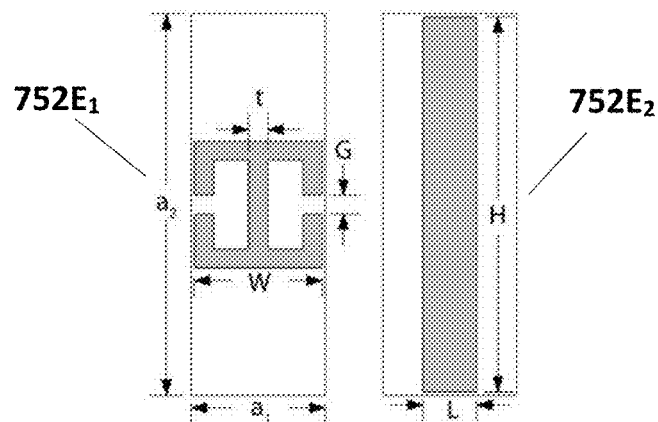
Figure 7F:
Figure 7G:
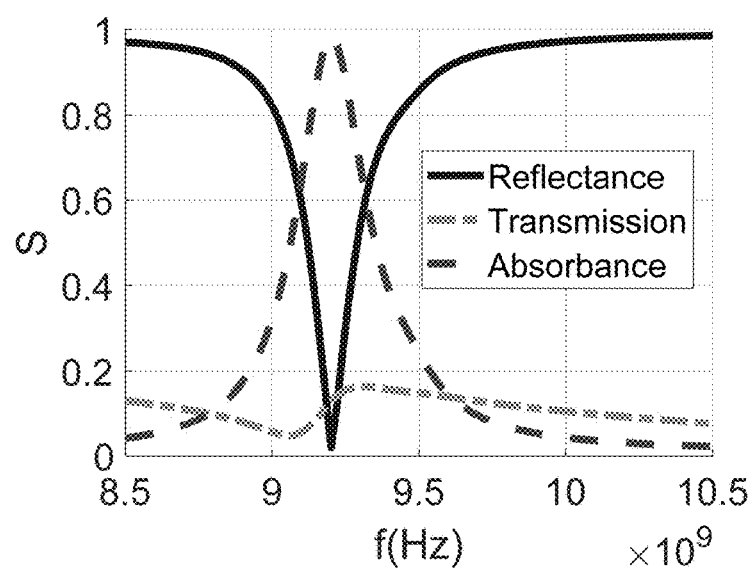

FIGS. 7A-7D show an electromagnetic skin 700 according to an embodiment. More particularly, FIG. 7A is an isometric view of EM skin 700, FIG. 7B is a top view thereof, and FIG. 7C is a bottom view, and FIG. 7D is a side view thereof. FIGS. 7E and 7F show details and dimensions of the prints on the top and bottom layers. FIG. 7G is a plot showing simulated scattering performance of the skin 700.

The EM skin 700 comprises a pliable thin film 751 with a plurality of incorporated miniature functional top inserts 752E$_1$ and 752E$_2$ attached to the top and bottom surfaces of the pliable thin film 751, respectively. The total thickness of the EM skin 700 is 0.87 mm. The miniature functional inserts 752E$_1$ and 752E$_2$ are arranged in a regular repeating patterns.

More, the functional inserts 752E$_1$ are configured as resonators. As shown in more detailed in FIGS. 7E and 7F, the functional inserts 752E$_1$ each have an "I-shape" and are arranged in discrete, isolated columns on the top surface of the pliable thin film 751. And the functional inserts 752E$_2$ each have a rectangular shape and are likewise arranged in discrete, isolated columns on the bottom surface of the pliable thin film 751. The functional inserts 752E$_1$ and 752E$_2$ may be formed of a conductive metal, such as copper or gold. The columns of the functional inserts 752E$_1$ and 752E$_2$ on the front and back surfaces of the film 751 correspond to each other. Nominal dimensions are shown on the aforementioned figures and specific dimensions for one exemplary embodiment tested are included in the table of FIG. 7F.

In the EM skin 700, each of the functional inserts 752E$_1$ on the top surface is configured as an electric ring resonator (ERR) whereas each of the functional inserts 752E$_2$ on the bottom surface is configured as wire resonator. Both resonators function as absorber of electromagnetic energy. For instance, functional inserts 752E$_1$ and 752E$_2$ were designed for operation in the X-band, frequency range of about 8.0-12.0 GHz.

By combining the two different shapes (i.e., electric ring resonator (ERR) in the top and wire resonator in the bottom), the electric resonance and magnetic resonance can be tuned to overlap each other which results in no reflected signal.

In other embodiments, the functional inserts might also include other combinations such as electrically coupled LC resonator (ELC) and split ring resonators (SRRs), and their variations can also be used to create absorption surface. See, e.g., Gu et al., "A broadband low-reflection metamaterial absorber," *Journal of Applied Physics,* 108(6), 2010 p. 064913; Ghosh et al., "Bandwidth-enhanced polarization-insensitive microwave metamaterial absorber and its equivalent circuit model, "*Journal of Applied Physics,* 115(10), 2014, p. 104503, and Singh et al. "Single and dual band 77/95/110 GHz metamaterial absorbers on flexible polyimide: substrate." *Applied Physics Letters,* 99(26), 2011, p. 264101, herein incorporated by reference in their entireties. This surface can also be designed for other bands as well within similar thickness. Any change of course will likely alter the performance of the EM skin 700.

The plot of FIG. 7G shows simulated scattering performance of the EM skin 700 over select frequencies ranging from 8.5-10.5×10$^9$ Hz (a sub-band of the X-band). The simulated data assumed a 0.87 mm-thick absorber metamaterial layer using FR4 dielectric layer of permittivity of 4.8 and loss tangent of 0.017. FR4 is a well-known NEMA grade designation for glass-reinforced epoxy laminate material. It is a composite material composed of woven fiberglass cloth with an epoxy resin binder that is flame resistant. The plot shows complete absorption, along with no reflection and no transmission at the same band.

Example 4: Thin (1 mm) Customized Reflection Phase Surface. (FIGS. 8A-8E)

Figure 8A:
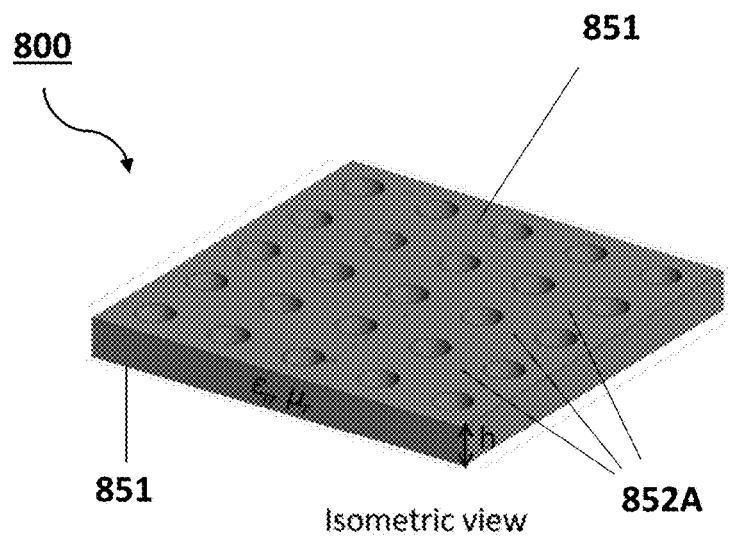
FIGS. 8A-8E show an electromagnetic skin and performance characteristics for Example, 4, a thin customized reflection phase surface, according to an embodiment.
Figure 8B:
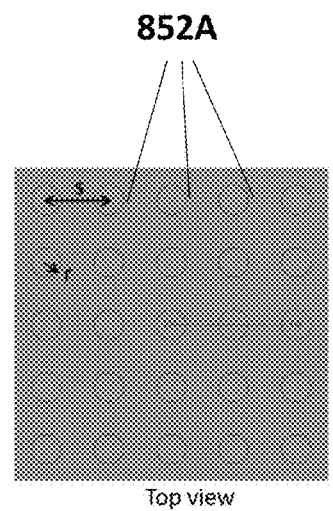
Figure 8C:
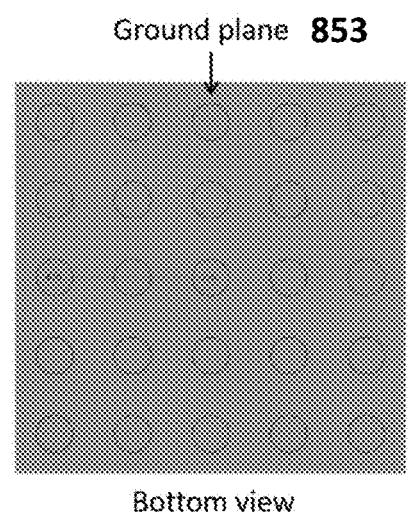
Figure 8D:
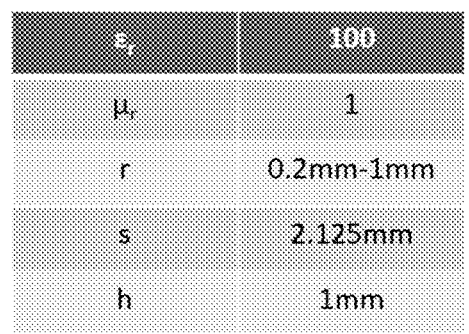

FIGS. 8A-8C show an electromagnetic skin 800 according to an embodiment. More particularly, FIG. 8A is an isometric view of EM skin 800, FIG. 8B is a top view thereof, and FIG. 8C is a bottom view thereof.

The EM skin 800 is comprised on a pliable thin film 851 having a plurality of embedded cylindrical material inserts 852A that functions as a customized reflection phase surface. The pliable thin film 851 may be 1 mm thick. The material inserts 852A are arranged in a regular repeating pattern in corresponding holes. Although, it will be appreciated that in other embodiments, other shape of inserts 852A and holes, such as hexagonal, square, diamond triangular might also be used. Any change will likely alter the performance of the EM skin 800. Nominal dimensions are shown on the aforementioned figures and specific dimensions for one exemplary embodiment tested are included in the table of FIG. 8D.

Unlike the surfaces that make up most equipment and vehicles that have a 180-degree reflection phase, this surface can adjust the reflection phase by changing the diameters of the constitutive cylinders embossed on the surface. Thus, a ground plane 853 may be provided on the bottom surface as shown in FIG. 8C to ensure that the bottom of the EM skin 800 is grounded and to not rely on another surface of the platform that may have non-ground-plane characteristics. On the other hand, if we know that the platform is a ground plane, there would be no need to repeat it in the EM skin and it could be omitted. An example of non-ground-plane platform is the plastic or composite surface that are used for aircraft and vehicle tops.

Figure 8E:
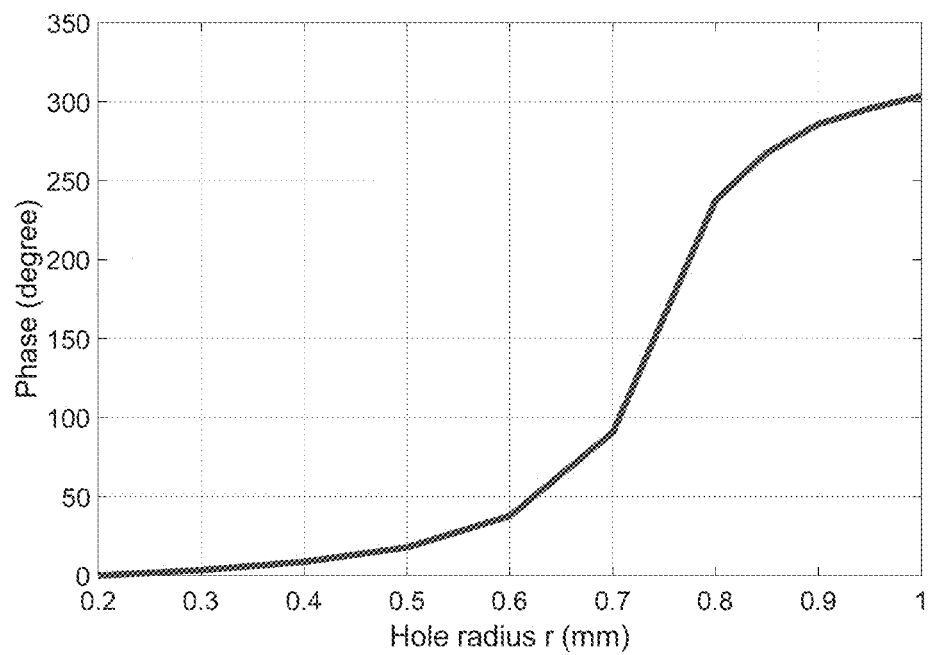

FIG. 8E is a plot showing simulated performance of the 1-mm-thick custom reflection-phase surface of EM skin 800. It shows the reflection phase as a function of the cylinder hole-radius on the surface for 10 GHz operation.

Example 5: Thin (1 mm) Reflective
Phase-Controlled Surface Using Self-Phased Patch
Elements (SPP). (FIGS. 9A-9D)

Figure 9A:
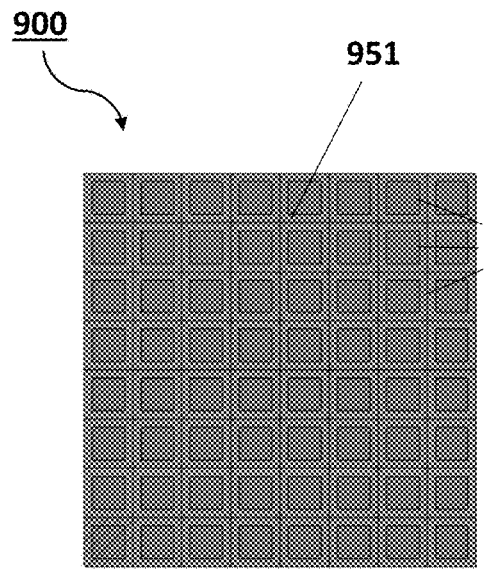
FIGS. 9A-9D show an electromagnetic skin and performance characteristics for Example 5, a thin reflective phase-controlled surface using self-phased patch elements, according to an embodiment.
Figure 9B:
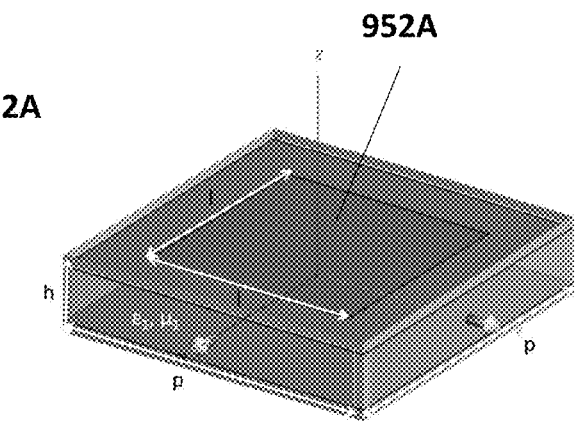
Figure 9C:
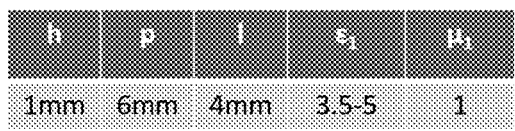

FIG. 9A is a top view of EM skin 900 according to an embodiment. The EM skin 900 is comprised on a pliable thin film 951 having a plurality of incorporated square-shaped material inserts 952A that can control the reflected phase signal. It functions as a customized reflection phase surface. The pliable thin film 951 may be 1 mm thick. The material insert 952A are square-shaped formed on the top surface of the film 951, such as by printing. FIG. 9B is an isometric detailed view of one metamaterial insert 952A of the electromagnetic skin 900. Nominal dimensions are shown on the aforementioned figures and specific dimensions for one exemplary embodiment tested are included in the table of FIG. 9C.

The surface of the EM skin 900 is composed of an array of self-phased patch (SPP) elements 952A. The SPP element is formed of a rectangular patch is printed over a dielectric layer with a metal backing, as shown in FIG. 9B. The dielectric layer has a barium strontium titanate (BST) film (e.g., around 20 um thick) embedded in it. The metal backing may be any conductive metal, like copper or gold. Upon applying voltage bias (e.g., less than 40V), the permittivity c of the BST film can be controlled to change the reflection phase of the element.

Figure 9D:
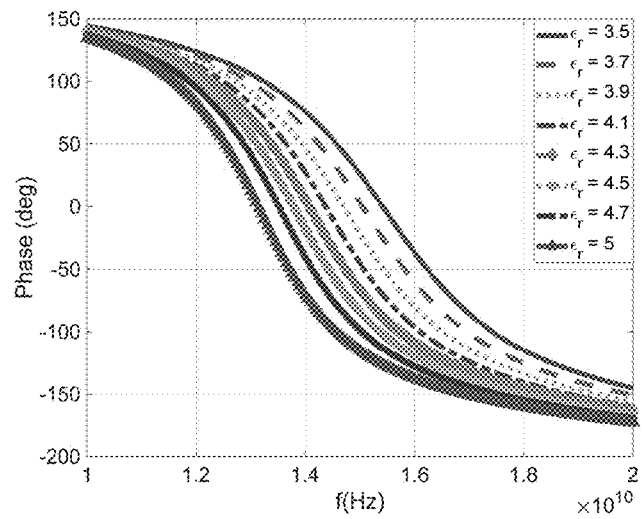

FIG. 9D is a plot showing simulated performance of 1-mm-thick SPP surface of the EM skin 900 for select frequencies ranging from $1-2 \times 10^{10}$ Hz. The plotted data demonstrates that for different permittivity values c the SPP surface achieves close to $\pi$ phase-tuning range.

Example 6: Thin (1.6 mm) Surface for Reflection
Polarization Conversion. (FIGS. 10A-10D)

FIGS. 10A and 10B show an electromagnetic skin 1000 according to an embodiment. More particularly, FIG. 10A is an isometric view of EM skin 1000, and FIG. 10B is an enlarged top view thereof, rotated 45 degrees.

The EM skin 1000 is configured as a polarization converter which converts an incident linearly polarized signal into a reflected circularly polarized signal. It is comprised on a pliable thin film 1051 having a plurality of embedded metamaterial inserts 1052B. The pliable thin film 1051 may be 1.6 mm thick. The inserts 1052B are configured as meander lines. The meander lines have a repeating rectangular line pattern as shown in FIG. 10B. Nominal dimensions are shown on the aforementioned figures and specific dimensions for one exemplary embodiment tested are included in the table of FIG. 10C.

By using meander line orientated 45 degrees with respect to incident linearly polarized signal, the reflected signal can be split into two components with 90 degrees phase shift, which results in circularly polarized (CP) signal. The conversion also applies to a CP incident signal that is reflected as a linearly polarized signal.

The specific design of EM skin 1000 uses a meander line configuration using one layer for the conversion. However, other shapes such as U-shape, I-shape and Jerusalem cross have also been used to design polarization conversion surface and may be used in other embodiments. See, e.g., Grady et al. "Terahertz metamaterials for linear polarization conversion and anomalous refraction," *Science,* 340(6138), 2013, pp. 1304-1307; Huang et al., "Multiple-band reflective polarization converter using U-shaped metamaterial," *Journal of Applied Physics,* 115(10), 2014. p. 103505; and Ma et al., "Broadband circular and linear polarization conversions realized by thin birefringent reflective metasurfaces," *Optical Materials Express,* 4(8), 2014, pp. 1717-1724, herein incorporated by reference in their entireties. Any change of course will likely alter the performance of the EM skin 1000.

FIG. 10D is a plot showing simulated performance of 1.6-mm-thick polarizer converter of EM skin 1000 for different incidence angles over select frequencies ranging from $1.3-1.7 \times 10^{10}$ Hz. It shows the CP axial ratio of the reflected signal for different incidence angles (measured from normal to the surface)

Example 7: Thin (1 mm) Backscattering Reduction
Surface Using Self-Phased Printed Elements (SPP).
(FIGS. 11A-11D)

Figure 11A:
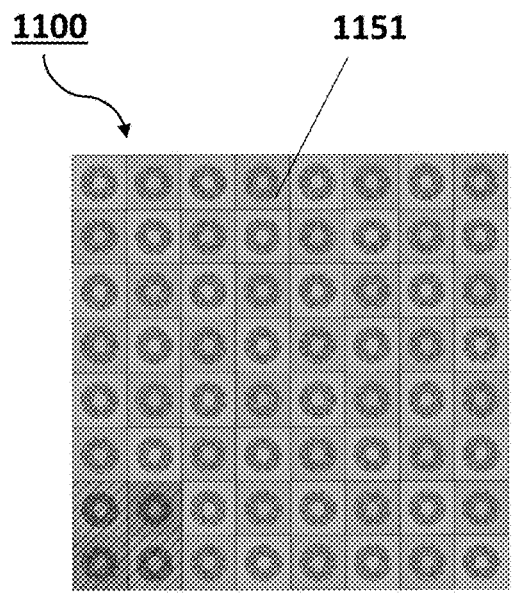
FIG. 11A-11D show an EM skin and performance characteristics for Example 7, a thin backscattering reduction surface using self-phased printed elements, according to an embodiment.
Figure 11B:
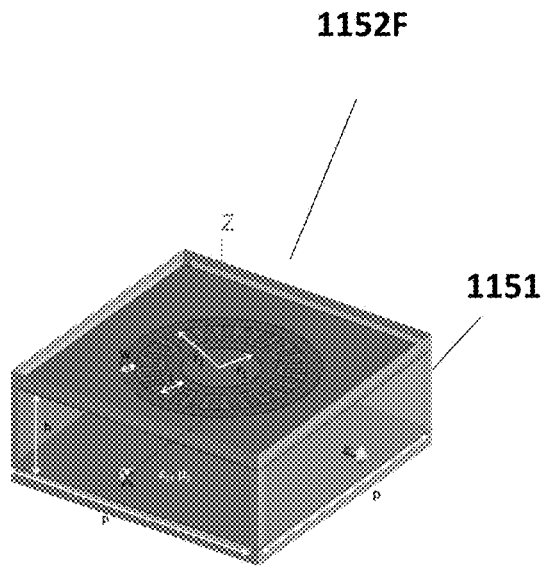
Figure 11C:
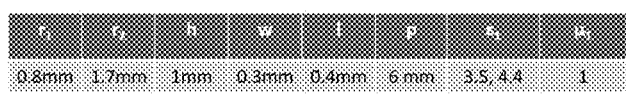

FIG. 11A is a top view of EM skin 1100 according to an embodiment. The EM skin 1100 is comprised of a pliable thin film 1151 having a plurality of incorporated circular inter-digitated (CID) metamaterial inserts 11B that can control the backscattering fields. It functions as a customized backscattering reduction surface. The pliable thin film 1151 may be 1 mm thick. The metamaterial insert 1152F are circular rings incorporated meandered slot formed on the top surface of the film 1151, such as by printing. FIG. 11B is an isometric detailed view of one metamaterial insert 1152F of the electromagnetic skin 1100. Nominal dimensions are shown on the aforementioned figures and specific dimensions for one exemplary embodiment tested are included in the table of FIG. 11C.

The surface of the EM skin 1100 is composed of an array of CID elements 1152F. The CID element is formed a dual-circular ring that incorporates a meandered slot or inter-digitated line in between, is printed over a dielectric layer with a metal backing, as shown in FIG. 11B. The dielectric constant of the CID element is chosen to be 3.5 and 4.5 and arranged in checkerboard pattern. This results the phase response among CID elements altered between 0 and 180°.

Figure 11D:
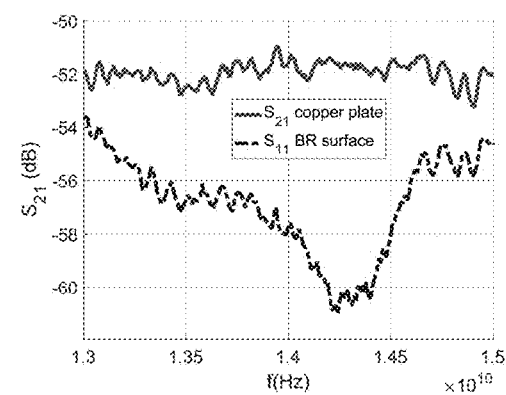

FIG. 11D is a plot showing measured performance of 1-mm-thick CID surface of the EM skin 1100 for select frequencies ranging from $1.3-1.5 \times 10^{10}$ Hz. The plotted data demonstrates that the backscattering using CID surface is significantly reduced in comparison with a metal (copper) surface.

FIGS. 12A-12E show various processing lines which may be used in the fabrication of the electromagnetic skin 50 according to embodiments.

The pliable thin film 51 of the EM skin 50 may be fabricated from polymers or co-polymers. Various thermoplastic and thermosetting polymers may be used as previously discussed above. The polymer material may be extruded into the pliable thin film. In some cases, the extrusion may be in-line with the formation of the electromagnetic skin. In others, thin film material may be preformed and provided on a roll or spool. The rolled material is later processed to form the electromagnetic skin. Subwavelength elements 52 may be incorporated into, impregnated, embedded and/or coated onto the polymer. There are different ways this may be achieved. The following are just a few exemplary fabrication processes which can be used to form the electromagnetic skin.

Figure 12A:
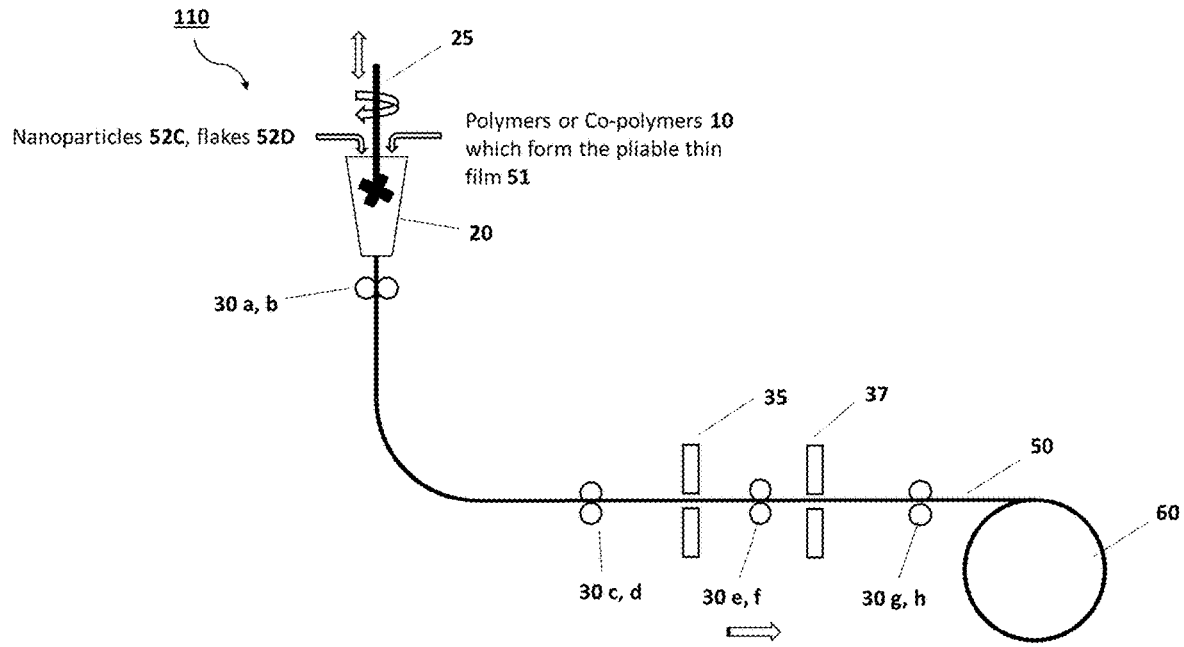

With reference to FIG. 12A, a first EM skin fabrication processing line 110 is shown. Nanoparticles 52C and/or flakes 52D and polymers or co-polymers 10 which form the pliable thin film 51 are introduced into an extruder 20. Typically, the polymers or co-polymers 10 are first added and liquefied (if necessary by heating) and the nanoparticles 52C and/or flakes 52D are later added. The extruder 20 may include a heater (not shown) and mixer 25 to thoroughly and homogenously mix the material. The mixed material is fed from the bottom of the extruder 20. Film rollers 30a-g along the process line help and shape the material into a thin sheet ultimately to its desired thickness. The electromagnetic skin material 50 is then spooled onto roll 60.

A heating element 35 and/or a cooling element 35 may also be included in some embodiments. They may be used to provide a heat treatment to the film 51. For instance, they may be employed to form heat-shrinkable film. As mentioned above, material is heated to just above the polymer's crystalline melting point, expanded, and then rapidly cooled. When the material is later heated above the crystalline melting point of the material, for instance, by an end user, the material will shrink back to its original size. Rollers 30 c-f (and/or additional rollers or stretching plates, elements, etc.) may be used to stretch and expand the polymer material while it is in the heated state above its crystalline melting point.

Alternatively, even without a heating element 35, the cooling element 37 may be used to quickly lower the temperature before spooling. Although in some case, the cooling element 37 may not be necessary if the processing line is sufficient long and can provide for sufficient air cooling of the material.

Figure 12B:
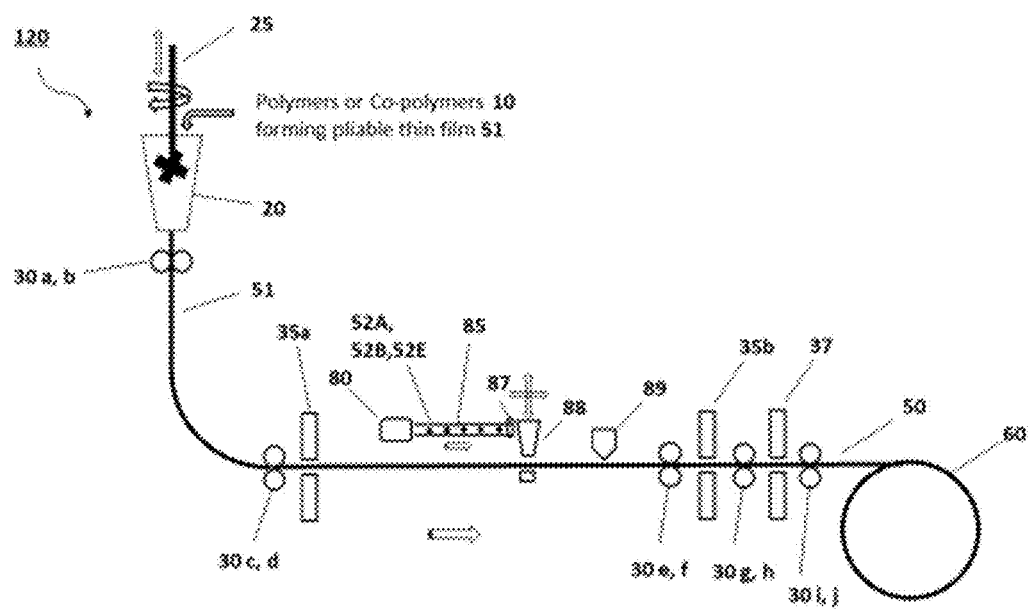

Next, with reference to FIG. 12B, a second EM skin fabrication processing line 120 is shown. Polymers or co-polymers 10 which form the pliable thin film 51 are introduced into an extruder 20. They are liquefied (if necessary by heating). The extruder 20 may include a heater (not shown) and mixer 25 to thoroughly and homogenously mix the material. A first heater 35a may be included to maintain the material in a hot state. The material may heated by heater 35a to be in soft state such that it more easily receives sub-wavelength elements 52. It could be close to liquid state.

The sub-wavelength elements 52 may be formed into a pattern in some embodiments. This pattern may be a 1-D array (going into the page), but could also be 2-D or 3-D (going into and across the page). For instance, sub-wavelength elements 52 are taken from hopper 80 and moved using a conveyor 85 to an arranger 87. The sub-wavelength elements 52 may be pre-formed in some cases. Alternatively, sub-wavelength elements 52. could be manufactured in-line, such as by casting or extrusion, ahead of the hopper 80. The arranger 87 makes a 1-D, 2-D or 3-D arrangement of the sub-wavelength elements 52. It may have receptacle specifically sized and shaped to receive and hold the individual sub-wavelength elements 52 and hold them in a proper orientation. The arrangement generally corresponds to a desired pattern of unit cells.

A placement head 88 picks up the arranged sub-wavelength elements 52 from the arranger 87 and inserts them into the hot and viscous film material. The placement head 88 may be capable of 2-D motion, or even additional degrees of freedom. It may use vacuum/suction or small grippers to hold the dielectric metamaterial while it moves them. In some embodiments, alternatively or additionally, a print head 89 may be provided for additive manufacturing (AM) of sub-wavelength elements 52. This may be advantageous for forming thin or surface mounted sub-wavelength elements on the film.

Additional rollers 30 c-j pull and continue to shape the material, now having the embedded sub-wavelength elements 52, into a thin sheet ultimately to its desired thickness. A second heater 35b and/or cooler 37 may be included and used as discussed above in the first processing line 110. The electromagnetic skin material 50 thus formed is then spooled onto roll 60.

With reference to FIG. 12C, a third EM skin fabrication processing line 130 is shown. Here, thin film material 40 may be pulled off of a roll 60a. The thin film 40 will be processed to form the pliable thin film 51. For instance, thin film 40 could be purchased from a third-party supplier or fabricated at an earlier time. Rollers 30 a,b pull the film 40 from roll 60a. A punch 70 forms orifices in the film 40 corresponding the unit cells for placement of sub-wavelength elements 52. The punch 70 could be a mechanical punch or could be a heated die which is capable of rapidly heating and forming orifices in polymer material. The punch 70 may make a 1D or 2D array of a plurality of orifices (going into the page) in one pressing. The orifices may pass, fully or partially, through the thickness of the film 40.

Similar to the second in line process 120, the sub-wavelength elements 52 are formed into a pattern. This pattern may be a 1-D array (going into the page), but could also be 2-D or 3-D (going into and across the page). For instance, sub-wavelength elements 52 are taken from hopper 80 and moved using a conveyor 85 to an arranger 87.

Again, the sub-wavelength elements 52 may be pre-formed in some case. In some embodiments, though, sub-wavelength elements 52 could be manufactured in-line, such as by casting or extrusion, ahead of the hopper 80. The arranger 87 makes a 1-D, 2-D or 3-D arrangement of the sub-wavelength elements 52. It may have receptacle specifically sized and shaped to receive and hold the individual sub-wavelength elements 52 in proper orientation.

The placement head 88 picks up the arranged dielectric metamaterial from the arranger 87 and inserts them into orifices formed in the film material. The placement head 88 may be capable of 2-D motion, or even additional degrees of freedoms. It may use vacuum/suction or small grippers to hold the 3D dielectric metamaterial while it moves them. In some embodiments, alternatively or additionally, a print head 89 may be provided for additive manufacturing (AM) of sub-wavelength elements 52. This may be advantageous for forming thin and/or surface mounted sub-wavelength elements.

The size (e.g., diameter, depth, etc.) of the orifices may be judicious sized to accommodate the sub-wavelength elements 52. In some cases, it may be an interference fit between them. Alternatively or additionally, the heater 35 may be used to heat and momentarily melt and flow the melted film material in the vicinity of inserted sub-wavelength elements 52 so as to affix them in the orifices. Additional rollers 30c-h pull and continue to shape the material, now having the inserted sub-wavelength elements 52, into a thin sheet ultimately to its desired thickness. In some embodiments, heater 35 and/or cooler 37 may be included and used as discussed above in the first processing line 110. The electromagnetic skin material 50 is then spooled onto roll 60b.

With reference to FIG. 12D, a fourth EM skin fabrication processing line 140 is shown. The electromagnetic skin material 50 having been formed in an earlier processing line (e.g. 110, 120 on 130) is pulled off of a roll 60. Rollers 30 a-d pull the EM skin 50 from roll 60. A section 55 of the EM skin 50 is cut from the line to desired dimensions with cutter 90. The cutter 90 may be a mechanical blade, or might be a laser cutter. The cutter 90 may preferably have multiple degrees of freedom for complex-shaped cuttings.

With reference to FIG. 12E, a fifth EM skin fabrication processing line 150 is shown. The section 55 of the EM skin 50 has adhesive 53 applied to a surface using applicator 95. The adhesive may be sprayed on with the applicator 95 in some embodiments. In others, the adhesive might be rolled on. Applicator 95 preferably is configured to have multiple degrees of freedom. The section 55 with the adhesive 53 applied can then be applied to a surface S.

FIGS. 13A and 13B show two attachment methods for attaching EM skin to a contoured surface according to embodiments. A section 55 of EM skin 50 will need to be sized (e.g., cut to size) for a given surface S. In FIG. 13A, attachment method 160 involves a section 55a of EM skin 50a which has adhesive 53 applied to its bottom surface. The adhesive 53 could be applied earlier such as by processing line 150 (see FIG. 12E). Or it could be applied to one or both of the section 55a and surface $S_2$ right before applying the section 55a to the surface oval/elliptical surface $S_2$. An individual can manually apply force and hold the section 55a in place until the adhesive bonds in place. A squeegee may be used to smooth out the adhesive 53 and EM skin 50a, to form bonded EM skin 50b. A simple jig tool corresponding to the contour might also be used.

With reference to FIG. 13B, attachment method 170 uses a section 55b of EM skin 50b which is heat-shrinkable. The section 55b of the EM skin 50b is initially wrapped around the circular surface $S_1$. A lamp, such as an infrared heat lamp, generates heat which is used to heat the EM skin 50b above the crystalline melting point of the material of the thin film material 51. This cause EM skin 50b to shrink and obtain conformal EM skin 50b" configuration. In some embodiments, adhesive 53 might further be applied.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

We claim:

1. A highly-conformal, pliable thin electromagnetic skin for altering at least one electromagnetic property of a surface comprising:
   a pliable thin film; and
   sub-wavelength elements incorporated into and/or on the pliable thin film which are smaller in scale than the wavelengths of electromagnetic radiation they are intended to influence,
   wherein the electromagnetic skin readily conforms to contours of a surface to which it attaches.

2. The electromagnetic skin of claim 1, wherein the electromagnetic skin is configured to alter at least one electromagnetic property of the surface by blocking, absorbing, enhancing, and/or bending waves of electromagnetic radiation.

3. The electromagnetic skin of claim 1, wherein the electromagnetic skin is configured to provide impedance, permeability, matching to free-space, energy absorbing with no reflection, reflection with different phases, polarization, electromagnetic shielding, and/or scattering characteristics.

4. The electromagnetic skin of claim 2, wherein the electromagnetic skin is configured to block, absorb, enhance and/or bend waves of electromagnetic radiation in the frequency range of about 8.0-12.0 GHz.

5. The electromagnetic skin of claim 2, wherein the electromagnetic skin is configured to block, absorb, enhance and/or bend waves of electromagnetic radiation in the microwave frequency range of about 0.3-300 GHz.

6. The electromagnetic skin of claim 1, wherein the pliable thin film has a dielectric constant or relative permittivity $\varepsilon_r$ of at least 2.9 and low loss tangent of less than 0.2 at microwave frequency range.

7. The electromagnetic skin of claim 1, wherein the pliable thin film is less than or equal to 2 mm in thickness.

8. The electromagnetic skin of claim 1, wherein the sub-wavelength elements comprise: material inserts, metamaterials inserts, nanoparticles, flakes and/or functional inserts.

9. The electromagnetic skin of claim 8, wherein the materials inserts are arranged in a regular repeating pattern.

10. The electromagnetic skin of claim 8, wherein the material inserts are configured as one or more of the following: a sphere, cube, cylinder, hexagon, donut, prism or disk.

11. The electromagnetic skin of claim 1, wherein the electromagnetic skin does not include a ground plane surface.

12. The electromagnetic skin of claim 1, further comprising an adhesive for attaching the skin to a surface.

13. The electromagnetic skin of claim 12, wherein the adhesive may be a permanent or a self-adhesive.

14. The electromagnetic skin of claim 1, wherein the pliable film is heat-shrinkable so as to readily conform to the surface with the application of sufficient heat.

15. A surface comprising the electromagnetic skin of claim 1.

16. The surface of claim 15, wherein the surface comprises equipment, a wall, a vehicle or an aircraft.

17. A method of altering at least one electromagnetic property of a surface comprising:
   attaching the electromagnetic skin of claim 1 to a surface.

18. The method of claim 17, wherein the electromagnetic skin is attached to the surface with an adhesive.

19. The method of claim 17, wherein the pliable film is heat-shrinkable and the method further comprises applying sufficient heat so that the pliable thin film shrinks and conforms to the surface.

20. The electromagnetic skin of claim 1, wherein the pliable thin film has a minimum bend radius, R, of approximately 3T, in which R is defined as follow:

$$R = T\left(\frac{50}{r} - 1\right),$$

where r is the tensile reduction of area of the pliable thin film and T is the thickness of the pliable thin film.

21. The electromagnetic skin of claim 1, wherein pliable thin film is configured to conform to non-flat contours of the surface to which it attaches with a surface conformity of less than 20 µm.

22. The electromagnetic skin of claim 1, wherein the electromagnetic skin is a single continuous flat sheet.

23. The electromagnetic skin of claim 1, wherein the electromagnetic skin is pre-formed before its attachment to a surface.

\* \* \* \* \*